United States Patent [19]

Kikuchi et al.

[11] Patent Number: 5,268,255
[45] Date of Patent: Dec. 7, 1993

[54] PHOTO-SETTING RESIST COMPOSITION, A PROCESS FOR PRODUCING A PRINTED CIRCUIT BOARD BY USING THE COMPOSITION, AND A PRINTED CIRCUIT BOARD OBTAINED BY USING THE COMPOSITION

[75] Inventors: Hiroshi Kikuchi, Zushi; Makio Watanabe, Fujisawa; Shinichiro Imabayashi; Reiko Yano, both of Yokohama; Isamu Tanaka, Yokosuka; Hitoshi Oka, Yokohama; Yukihiro Taniguchi, Chigasaki; Shigeru Fujita, Yokohama, all of Japan

[73] Assignee: Hitachi, Ltd., Tokyo, Japan

[21] Appl. No.: 767,893

[22] Filed: Sep. 30, 1991

[30] Foreign Application Priority Data

Sep. 28, 1990 [JP] Japan ................................ 2-256895

[51] Int. Cl.⁵ .......................... C08F 2/50; G03F 7/004
[52] U.S. Cl. ..................................... 430/280; 430/286; 430/288; 430/918; 522/14; 522/16; 522/103; 522/107; 522/170
[58] Field of Search .................. 522/14, 16, 170, 103, 522/107; 430/280, 286, 288, 918

[56] References Cited

U.S. PATENT DOCUMENTS

| | | |
|---|---|---|
| 4,501,689 | 2/1985 | Yanagawa .................. 522/9 |
| 4,943,516 | 7/1990 | Kamayachi et al. ......... 522/26 |
| 5,091,283 | 2/1992 | Tanaka et al. ............. 430/280 |

*Primary Examiner*—Susan Berman
*Attorney, Agent, or Firm*—Antonelli, Terry, Stout & Kraus

[57] ABSTRACT

A printed circuit board has a resist layer made from a photo-setting resist composition containing:

(A) a polyfunctional unsaturated compound which is solid at room temperature,
(B) a polyfunctional unsaturated compound which is liquid at room temperature,
(C) a photopolymerization initiator,
(D) an epoxy resin,
(E) at least one member selected from the group consisting of:
  (i) a curing agent for the epoxy resin and either melamine or the derivative thereof, and
  (ii) a compound having a 2,4-diamino-s-triazine ring and an imidazole ring in the molecule.

12 Claims, 4 Drawing Sheets

FIG. I(1)
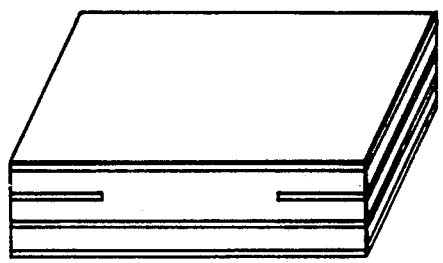
COPPER-CLAD LAMINATE
FIG. I(2)
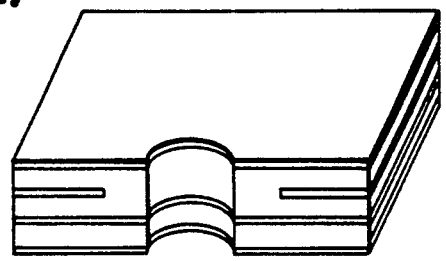
HOLE BORING AND CATALYST APPLICATION
FIG. I(3)
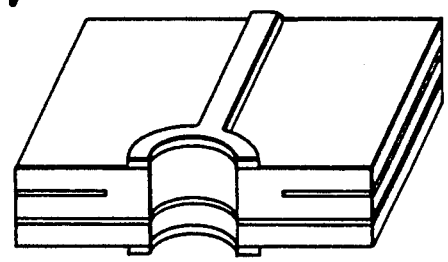
PATTERN FORMATION
FIG. I(4)
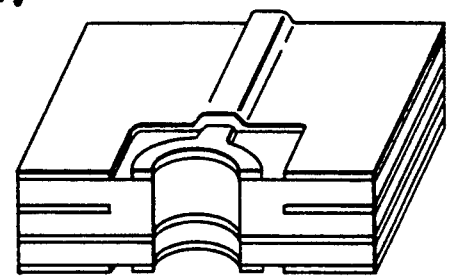
PLATING-RESISTANT SOLDER RESIST
FIG. I(5)
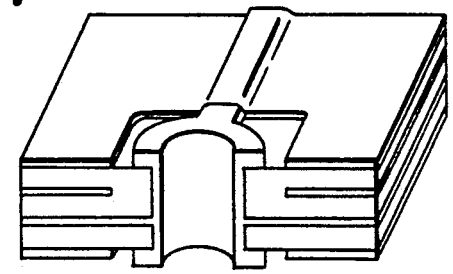
ELECTROLESS COPPER PLATING

COPPER-CLAD LAMINATE

HOLE BORING AND CATALYST APPLICATION

COPPER ELECTROPLATING

PATTERN FORMATION

SOLDER RESIST

PHOTO-SETTING RESIST COMPOSITION, A PROCESS FOR PRODUCING A PRINTED CIRCUIT BOARD BY USING THE COMPOSITION, AND A PRINTED CIRCUIT BOARD OBTAINED BY USING THE COMPOSITION

FIELD OF THE INVENTION

The present invention relates to a photosetting resist composition and a printed circuit board obtained by using the composition.

DESCRIPTION OF RELATED ART

Examples of resists of UV exposure-and-development type used for producing conventional printed circuit boards are those disclosed in JP-B-51-40451, JP-B-52-30969, JP-A-60-208377, JP-A-62-4390 and JP-A-62-253613. Such resists have been used mainly in the production process of a printed circuit board illustrated in FIG. 2. FIG. 2 illustrates the production process of a printed circuit board, which is known as subtractive process, by taking the case of a four-layer board. This process comprises using as a starting material a copper-clad laminate having an inner layer and two pieces of copper foil laminated on the upper and lower sides of the inner layer, boring through holes at predetermined positions of the copper-clad laminate, placing a catalyst in the inner wall of the through holes, conducting copper electroplating on the whole surface of the laminate including the inner wall of the through holes, forming a predetermined circuit pattern on the upper and/or lower side of the laminate by etching, and applying a solder resist onto the etched pattern. As the solder resist, thermosetting epoxy resin-based solder resist which form a pattern by screen printing have been used. With an increase of the density of wiring on printed circuit boards, solder resists of UV exposure-and-deposition type having a good precision of coating have been developed.

On the other hand, in the so-called partly additive process illustrated in FIG. 1, it is absolutely necessary to use a solder resist resistant to plating reaction and having utterly different properties as compared with the solder resist used for a printed circuit board produced by the subtract process shown in FIG. 2.

The term "partly additive process" refers to a process which comprises the steps of boring through holes at predetermined positions of a copper-clad laminate, applying a catalyst on the whole surface of the laminate including the inner wall of the through holes, forming a printed circuit pattern on the upper and/or lower side of the catalyst-applied laminate, forming a solder resist having a resistance to plating reaction on predetermined areas of the printed-circuit-pattern-formed laminate and forming a plated film at the very portions required to be plated such as the inner wall of the through-holes, lands and connectors by electroless copper plating. Thus, the partly additive process is different from the subtract process.

As compared with the subtract process, the partly additive process is advantageous in that it entails a lower cost and achieves a higher precision. That is, the partly additive process is simple, causes only a small loss and permits high-precision wiring for the following reasons. Unlike in the subtract process wherein plating is conducted on the whole surface, plating is partially conducted in the very portions required to be plated in the partly additive process. In addition, for forming the conductor circuit, it is sufficient to etch only the thin copper foil of the copper-clad laminate in the partly additive process.

However, for obtaining the advantages of the partly additive process, it is necessary that the solder resist used in the partly additive process should satisfy special requirements. The requirements are very severe, as follows. The solder resist is immersed for a long period of time in an electroless copper plating solution at an elevated temperature under a strongly alkaline condition. Moreover, the deposition potential of electroless copper plating of $-0.6$ to $-0.9$ V (reference: saturated calomel electrode) acts on the wiring pattern of copper under the solder resist for a long period of time. Throughout the steps that are carried out under severe conditions, the solder resist should maintain a sufficient heat resistance as a solder resist and sufficient insulating properties which the solder resist should have for protecting the printed circuit board as a permanent resist.

As the solder resists having a resistance to plating reaction which are suitable for such a purpose, there are known thermosetting epoxy resin-based solder resists used for forming a pattern by screen printing. JP-A-58-147416 discloses an example of such solder resists. There are also known solder resists of UV exposure-and-development type which have a resistance to plating reaction. JP-A-62-265321 discloses an example of such solder resists. These solder resists of UV exposure-and-development type having a resistance to plating reaction are suitable for producing a high-density printed circuit board because a pattern is formed of them by UV exposure and development, so that a very high precision can be attained. They, however, involve the following problem when used for mass production in which plating is conducted for producing a large number of printed circuit boards. Since the resists contain dicyandiamide as a constituent, a slight amount of dicyandiamide is dissolved in an electroless copper plating solution during electroless copper plating for a long period of time to affect the deposition condition of a copper plating layer seriously, resulting in a deteriorated reliability of through holes.

The present invention is intended to realize a solder resist of UV exposure-and-development type having a resistance to plating reaction which is free from such defects of the prior art, and facilitate the production of a high-density printed circuit board by the partly additive process. A practical resist should have various characteristics, and it is seriously deteriorated in reliability even if it lacks one of the characteristics. Therefore, an object of the present invention is to provide a resist composition having all of many characteristics which cannot be realized merely by combining conventional techniques. Problems which should be solved for this object are as follows.

a) It is absolutely necessary for the resist of the present invention to contain no dicyandiamide. In mass production in which plating is conducted for producing a large number of printed circuit boards, the following problem is caused when the resist contains dicyandiamide as a constituent. During electroless copper plating for a long period of time, a slight amount of dicyandiamide is dissolved in an electroless copper plating solution to affect the deposition condition of a copper plating layer seriously, resulting in a deteriorated reliability of through holes. Therefore, the resist of the present invention should satisfy the following requirements at the same time without containing dicyandiamide.

b) It is absolutely necessary for the resist of the present invention to be curable by exposure to UV light. In detail, the resist should undergo crosslinking reaction on irradiation with UV light (ultraviolet light) of 300 to 400 nm which is suitable for production of a printed circuit board, to be cured only in the irradiated portion. It is preferable to cure the resist at a practical irradiation dose of 0.02 to 10 J/cm$^2$.

c) It is absolutely necessary that when the resist of the present invention is cured by UV irradiation, there should be a suitable difference in solubility in a developing solution between the cured portion and the uncured portion, and that the resolution after development should be satisfactory. In other words, the resist should have a high developability by a suitable solvent.

d) It is absolutely necessary that after being applied on both sides of a printed circuit board, the resist of the present invention should be able to be exposed to light on both sides of the printed circuit board at the same time. That is, the resist should not cause the so-called "backside curing", i.e., the problem that UV light casted from one side is transmitted by the resist and the board to cure the resist on the opposite side. Unless such a problem is solved, a negative mask pattern used on one side of the board which is different from that used on the opposite side is formed also on the opposite side, so that the practicability is greatly deteriorated.

e) It is absolutely necessary that when exposed to UV light, the resist of the present invention should be able to be exposed in close contact with a negative mask. Unless the resist satisfies this requirement, the resist adheres to the negative mask due to the adhesive properties of the resist itself and the softening of the resist by temperature rise during the exposure. Therefore, it becomes necessary to wash the negative mask each time the exposure is conducted, so that the practicability is greatly deteriorated.

f) It is absolutely necessary for the resist of the present invention to have satisfactory coating properties. That is, it should have viscosity characteristics as suitable ink which are such that when the resist is applied on one side of a printed circuit board by screen printing or with a roll coater, the resulting coating film has a uniform thickness and no void.

g) The resist of the present invention should be able to be applied on one side of a printed circuit board, predried, and then applied on the other side. When the predrying is not sufficient, it becomes impossible to apply the resist by printing on the other side of the printed circuit board which still has the viscous resist on the one side. When the predrying is excessive, the reaction of the resist proceeds, resulting in a difference in characteristics between the resist on the one side and that on the other side. For preventing such a problem, it is absolutely necessary that the resist can be properly predried.

h) It is absolutely necessary that in a product, i.e., a printed circuit board having the resist of the present invention formed thereon, the resist should have such a high heat resistance that it can withstand repeated solderings as a solder resist. That is, it is absolutely necessary that the resist on the printed circuit board should not show a trouble such as swelling or peeling even when immersion in solder at about 260° C. for 10 seconds is repeated about 10 times, or there is conducted soldering by hot air, an infrared ray, solvent vapor or the like which corresponds to the repeated immersions in solder. It should be emphasized that such a characteristic is required of the resist which has undergone severe electroless copper plating.

i) it is absolutely necessary that in the product, i.e., the printed circuit board having the resist of the present invention formed thereon, the resist should be able to retain high insulating properties. That is, the resist should be able to retain such excellent insulating properties that insulation between wiring portions should not be deteriorated, in particular, insulating properties at moistened state. It should be emphasized that such a characteristic is required of the resist which has undergone severe electroless copper plating.

j) It is absolutely necessary that in the product, i.e., the printed circuit board having the resist of the present invention formed thereon, the resist should have a high chemical resistance. In detail, the resist should not be dissolved in or changed in quality by a flux for soldering, a solvent for washing and the like which are used in a packaging step in which parts are mounted on the printed circuit board. It should be emphasized that such a characteristic is required of the resist which has undergone severe electroless copper plating.

k) It is absolutely necessary that after being formed on a printed circuit board produced by the formation of a conductor circuit, the resist of the present invention should have a satisfactory alkali resistance. That is, since the resist undergoes severe electroless copper plating, the resist should not be dissolved in or changed in quality by an electroless copper plating solution which has a high temperature and is strongly alkaline.

l) It is absolutely necessary that after being formed on the printed circuit board produced by the formation of a conductor circuit, the resist should have a satisfactory resistance to plating reaction. Specifically, such a characteristic is as follows. It is absolutely necessary that when the partly additive process is employed, the resist on the conductor circuit should not be peeled by electroless copper plating. The printed circuit board having the resist formed thereon is immersed for a long period of time in a severe electroless copper plating solution which has a high temperature and is strongly alkaline. Furthermore, the deposition potential of electroless copper plating of −0.6 to −0.9 V acts on a wiring pattern of copper under the solder resist for a long period of time. Even after such a severe step, the deterioration of the adhesive strength or peeling should not take place in the boundary surface between copper and the resist.

Although the mechanism of the occurrence of the deterioration of the adhesive strength or the peeling has not been clarified, it is known by experience, for example, that the deposition potential of electroless copper plating becomes a driving force for the peeling reaction and that the peeling proceeds very rapidly when copper oxide is present in the boundary surface between copper and the resist. From these facts, it is conjectured that copper oxide in the boundary surface between circuit copper foil and the resist is electro-chemically reduced by the deposition potential of electroless copper plating, so that the bonding between copper and the resist which is responsible for the adhesive strength is destroyed, resulting in the peeling. Therefore, the resistance to plating reaction (the peeling resistance) is a kind of resistance to peeling of a resist caused by a cathode.

Such resistance to plating reaction should be strictly distinguished from the term "resistance to plating". In general, the term "resistance to plating" often means the above-mentioned alkali resistance, which is utterly different from the resistance to plating reaction (the peeling resistance).

The problem of the resistance to plating reaction (the peeling resistance) is one of points to which the keenest attention should be paid when a printed circuit board is produced by the partly additive process. Unless this problem is solved, the resist on the circuit copper foil is peeled, so that the practicality is completely lost.

m) It is absolutely necessary that after the formation of the resist on the printed circuit board produced by the formation of a conductor circuit, no harmful component of the resist should be dissolved or extracted in a plating solution during electroless copper plating. If the problem of such resistance to dissolution by plating remains unsolved, the component dissolved or extracted from the resist has an undesirable influence on the deposition reaction of a copper plating layer, so that the plating reaction is stopped or retarded, resulting in remarkable deterioration of the crystalline orientation and physical properties of the deposited copper. Therefore, the reliability of connection of through holes of the printed circuit board and the wettability and the reliability of connection of solder are deteriorated, so that the practicality is completely lost.

The mechanism by which the harmful component has the undesirable influnece on the deposition reaction of a copper plating layer is very complicated because the plating reaction involves the catalytic reaction of a reducing agent on the copper surface. Therefore, it is necessary to choose the composition of the resist on the basis of experience to assure the resistance to dissolution by plating.

The problem of the resistance to dissolution by plating is one of points to which the keenest attention should be paid when a printed circuit board is produced by the partly additive process. Unless this problem is solved, the printed circuit board produced is of no practical use at all. Furthermore, the electroless copper plating solution is contaminated, so that the disposal of a large amount of the plating solution becomes necessary, resulting in a great loss.

In addition, the resistance to dissolution by plating should be strictly distinguished from the abovementioned alkali resistance. In detail, when the alkali resistance is not sufficient, the resist itself is dissolved in an alkali. On the other hand, when the resistance to dissolution by plating is not sufficient, only a specific component in the resist is dissolved in a plating solution.

An object of the present invention is to provide a photo-setting resist composition which satisfies all of the above requirements a) to m).

Another object of the present invention is to provide a process for producing a printed circuit board by using the photo-setting resist composition which satisfies all of the above requirements a) to m).

A still another object of the present invention is to provide a printed circuit board obtained by using the photo-setting resist composition which satisfies all of the above requirements a) to m).

SUMMARY OF THE INVENTION

According to the present invention, there are provided:

a photo-setting resist composition which comprises:

(A) a polyfunctional unsaturated compound which is solid at room temperature, (B) a polyfunctional unsaturated compound which is liquid at room temperature, (C) a photopolymerization initiator, (D) an epoxy resin, (E) at least one member selected from the group consisting of:

(i) a curing agent for the epoxy resin and either melamine or the derivative thereof, and (ii) a compound having a 2,4-diamino-s-triazine ring and an imidazole ring in the molecule;

a process for producing a printed circuit board which comprises the steps of:

boring through holes at predetermined positions of a double-sided copper-clad laminate board, activating the inside wall of the through holes with a catalyst for electroless copper plating, forming a conductor circuit pattern on each side of the board by etching the board at predetermined portions, forming a resist layer on each side of the conductor-circuit-pattern-formed board by coating the above photo-setting resist composition to each side of the conductor-circuit-pattern-formed board, drying the coated layer, exposing the dried layer to light, developing the light-exposed layer and curing the developed layer, and forming a thick electroless plated copper film on the resist-layer-formed-board on predetermined areas including at least the inside wall of the through holes; and a printed circuit board having a resist layer made from the above photo-setting resist composition.

BRIEF DESCRIPTION OF THE DRAWINGS

FIG. 1 shows cross-sectional views showing a procedure of producing the printed circuit board of the present invention by the partly additive process.

DETAILED DESCRIPTION OF THE INVENTION

Figure 2:
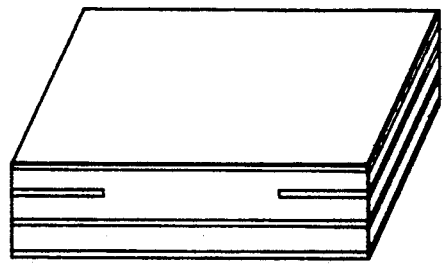
FIG. 2 shows cross-sectional views showing a procedure of producing a printed circuit board by the subtract process.
Figure 2:
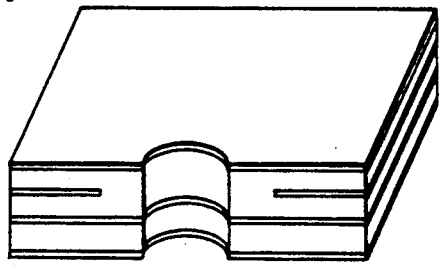
Figure 2:
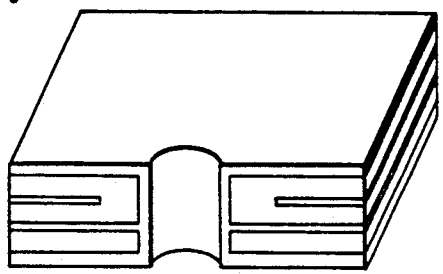
Figure 2:
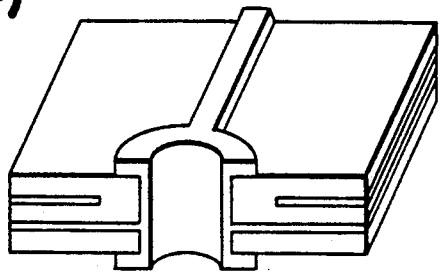
Figure 2:
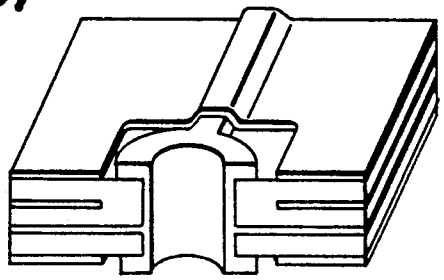

The polyfunctional unsaturated compound which is solid at room temperature, i.e., one of the compounds used in the present invention, is a compound having a large number of unsaturated groups in the molecule, such as a diallyl phthalate resin. By the use of a suitable compound as such a solid resin, there can be obtained a resist which satisfies the above-mentioned many requirements at the same time.

Specifically, the diallyl phthalate resin comprises a prepolymer of diallyl ester of phthalic acid, isophthalic acid or terephthalic acid. Such a prepolymer is referred to also as β-prepolymer. Its production process and physical properties are described in detail, for example, in Naoki Yoshimi "Diallyl Phthalate Resins", Nikkan Kogyo Shinbun Co., Ltd. (1969). A commercial product of the prepolymer is available from DAISO CO., LTD. In the present invention, a prepolymer having a molecular weight of approximately 3,000–30,000 is preferably used. When the molecular weight of the prepolymer is less than 3,000, the ability of the resist to be exposed to light in close contact with a negative mask (hereinafter referred to as "close-contact exposability") tends to be insufficient. When it is more than 30,000, the developability tends to be deteriorated. The prepolymer may contain a small amount of diallyl phthalate monomer or γ-polymer having a three-dimensional network structure which remains or is produced, respectively, in the production of the prepolymer.

In addition, the photosensitive solder resist composition having a resistance to plating of the present invention comprises a polyfunctional unsaturated compound having at least two ethylenic linkages in the molecule which is liquid at room temperature. Such a compound can be obtained, for example, by the esterification reaction of an unsaturated carboxylic acid with a polyhydroxy compound having two or more hydroxyl groups. The unsaturated carboxylic acid includes acrylic acid, methacrylic acid, itaconic acid, crotonic acid, maleic acid, etc. On the other hand, the polyhydroxy compound having two or more hydroxyl groups includes ethylene glycol, diethylene glycol, trimethylolpropane, pentaerythritol, dipentaerythritol, and the derivatives thereof.

The compound obtained by the esterification reaction of such an unsaturated carboxylic acid with such a polyhydroxy compound includes, for example, diacrylate, dimethacrylate and triacrylate compounds typical examples of which are diethylene glycol diacrylate, polyethylene glycol diacrylate, neopentyl glycol diacrylate, 1,5-pentanediol diacrylate, 1,6-hexanediol diacrylate, trimethylolpropane triacrylate, pentaerythritol triacrylate, diethylene glycol dimethacrylate, and 1,3-butanediol dimethacrylate; polyfunctional acrylate and methacrylate compounds typical examples of which are tri-, tetra-, penta- or hexaacrylate or tri-, tetra-, penta- or hexamethacrylate of dipentaerythritol, and tritetra-, penta- or hexaacrylate or tri-, tetra-, penta- or hexamethacrylate of sorbitol; oligo-ester acrylates; and oligo-ester methacrylates.

A compound produced by the addition reaction of a divalent or higher-order polyvalent epoxy resin with an unsaturated carboxylic acid can also be used as the polyfunctional unsaturated compound which is liquid at room temperature. As such a compound, there can be exemplified polyfunctional unsaturated compounds which are liquid at room temperature and are produced by the addition reaction of a bisphenol A type or novolak type epoxy resin with acrylic acid or methacrylic acid.

The larger the number of functional groups contained in the molecule, the more preferable the polyfunctional unsaturated compound. The number of the functional groups is, which increasing preferance, at least 2, 3 or more, and 6 or more.

The examples given above do not limit the addition of a monofunctional unsaturated compound. If necessary, a mixture of the polyfunctional unsaturated compound and a monofunctional unsaturated compound can be used.

The photosensitive solder resist composition having a resistance to plating of the present invention further comprises a photopolymerization initiator. The photopolymerization initiator includes, for example, acetophenone, benzophenone, Michler's ketone, benzil, benzoin, benzoin alkyl ethers, benzoin alkyl ketals, thioxanthone, anthraquinone, and the derivatives or analogs thereof; 1-hydroxycyclohexyl phenyl ketone and the derivatives or analogs thereof; and α-aminoketone compounds a typical examples of which is 2-methyl-1-[4-(methylthio)phenyl]-2-morpholino-propene-1. If necessary, a mixture of photopolymerization initiators may be used. If necessary, there may be used amine compounds and the like which improve the action of the photopolymerization initiator.

In addition, the photosensitive solder resist composition having a resistance to plating of the present invention comprises an epoxy resin. The epoxy resin is one which has two or more epoxy groups on the average in the molecule. The epoxy resin includes, for example, polyglycidyl ethers or polyglycidyl esters which are obtained by reacting epichlorohydrin with a polyhydric phenol such as bisphenol A, halogenated bisphenol A, catechol or resorcinol, or a polyhydric alcohol such as glycerol in the presence of a basic catalyst; epoxynovolak resins obtained by condensing a novolak type phenolic resin with epichlorohydrin; epoxidized polyolefins and epoxydized polybutadienes which are obtained by epoxidation by the peroxidation method; dicyclopentadiene-modified oxides; and epoxidized vegetable oil.

Furthermore, the photosensitive solder resist composition having a resistance to plating of the present invention comprises a curing agent for the epoxy resin. As the curing agent for the epoxy resin, amine type compounds and imidazole derivatives are suitable. The amine type compounds include, for example, aliphatic amine compounds typical example of which are ethylenediamine, hexamethylenediamine and triethylenetetramine; and aromatic amine compounds typical examples of which are diphenylamine, 4,4'-diaminodiphenylmethane and phenylenediamine. The imidazole derivatives include, for example, alkylimidazoles such as 2-methylimidazole, 2-ethyl-4-methylimidazole, 2-phenylimidazole, etc.; imidazole derivatives represented by purine, 2,6-diaminopurine, 2-aminobenzimidazole, etc.; and compounds obtained by the addition reaction of 2,4-diamino-6-vinyl-s-triazine with an alkylimidazole, for instance, 2,4-diamino-6-{2'-methylimidazole-(1')}ethyl-s-triazine, 2,4-diamino-6-{2'-ethyl-4'-methylimidazole(1')}ethyl-s-triazine, 2,4-diamino-6-{2'-undecylimidazole-(1')}ethyl-s-triazine, 2,4-diamino-6-{2'-phenylimidazole-(1') ethyl-s-triazine and 2,4-diamino-6-{2'-methylimidazole-(1')}ethyl-s-triazine/isocyanuric acid adduct. As other amine type curing agents, boron trifluoride monoethylamine can be exemplified. If necessary, a mixture of amine type curing agents may be used. Compounds obtained by the addition reaction of 2-vinyl-4,6-diamino-s-triazine with an alkylimidazole are preferable particularly because when they are used, the resulting resist has a high storage stability and is not gelatinized by drying.

The photosensitive solder resist composition having a resistance to plating of the present invention further comprises melamine or the derivatives thereof. Typical examples of melamine and the derivatives thereof are melamine, 2,4-diamino-6-methyl-s-triazine and 2,4-diamino-6-phenyl-s-triazine. The derivatives of melamine also include compounds obtained by the addition reaction of 2,4-diamino-6-vinyl-s-triazine with an alkylimidazole, for example, 2,4-diamino-6-{2'-methylimidazole-(1')}ethyl-s-triazine, 2,4-diamino-6-{2'-ethyl-4-methylimidazole-(1')}ethyl-s-triazine, 2,4-diamino-6-{2'-undecylimidazole-(1')}ethyl-s-triazine, 2,4-diamino-6-{2'-phenylimidazole-(1')}-ethyl-s-triazine and 2,4-diamino-6-{2'-methylimidazole-(1')} ethyl-s-triazine/isocyanuric acid adduct.

Such derivatives of melamine are preferably those containing a diaminotriazine skeleton in the molecule. Their solubility in water is preferably about 1 wt. % or less, more preferably about 0.1 wt. % or less, most preferably about 0.01 wt. % or less.

In addition, the photosensitive solder resist composition having a resistance to plating of the present invention may comprise a defoaming agent. As the defoaming agent, there are mainly used organosilicon compounds containing a siloxane linkage which are represented by silicone oil.

Furthermore, the photosensitive solder resist composition having a resistance to plating of the present invention may comprise a pigment. As the pigment, there are mainly used phthalocyanine, phthalocyanine green, phthalocyanine blue and the like which are highly heat-resistant pigments having a phthalocyanine skeleton.

The photosensitive solder resist composition having a resistance to plating of the present invention may further comprise an organic solvent. As the organic solvent, there are mainly used, for example, high-boiling solvents such as methyl cellosolve, ethyl cellosolve, butyl cellosolve, acetates of these cellosolves, methyl carbitol, ethyl carbitol, butyl carbitol, terpineol, etc.

Moreover, the photosensitive solder resist composition having a resistance to plating of the present invention can be further improved in performance characteristics by adding other additives if necessary. As the other additives, there can be exemplified thioxotropic agents for adjusting the viscosity of the resist, fillers for adjusting the heat resistance of the resist, ultraviolet absorbers for adjusting the resolution of the resist, and polymerization inhibitors for adjusting the storage stability of the resist.

An example of the thioxotropic agents is micronized quartz. An example of the fillers is powdered quartz. Examples of the ultraviolet absorbers are 4-t-butyl-4'-methoxy-dibenzoylmethane, 2-ethylhexyl-p-methoxycinnamate, 2-(2'-hydroxy-3',5'-di-tert-butylphenyl)-benzotriazole, 2-(2'-hydroxy-3'-tert-butyl-5'-methylphenyl)-5-chlorobenzotriazole, 2-(2'-hydroxy-3',5'-di-tert-butylphenyl)-5-chlorobenzotriazole, and 2-{2'-hydroxy-3-(3",4",5",6"-tetrahydrophthalimidomethyl)-5'-methylphenyl]benzotriazole. Examples of the polymerization inhibitors are hydroquinone and the derivatives thereof.

The preferred proportions of the compounds of the composition of the present invention blended are as follows. Per 100 parts by weight of the polyfunctional unsaturated compound which is solid at room temperature, the proportion of the polyfunctional unsaturated compound which is liquid at room temperature is preferably 5 to 30 parts by weight, more preferably 10 to 30 parts by weight, most preferably 10 to 20 parts by weight; the proportion of the photopolymerization initiator preferably is 2 to 12 parts by weight; the proportion of the epoxy resin is preferably 5 to 40 parts by weight; the proportion of the curing agent for the epoxy resin is preferably 0.1 to 5 parts by weight; the proportion of melamine or the derivatives thereof is preferably 1 to 20 parts by weight, more preferably 2 to 15 parts by weight, most preferably 4 to 10 parts by weight; the proportion of the defoaming agent is preferably 0.5 to 10 parts by weight when it is added; the proportion of the pigment is preferably 0.2 to 10 parts by weight when it is added and the proportion of the organic solvent is preferably 50 to 100 parts by weight when it is added. If necessary, one compound may be used both as the curing agent for the epoxy resin and as the derivative of melamine.

The upper limits and the lower limits of such proportions were carefully chosen so that all of the above requirements (a) to (m) for the present invention can be satisfied at the same time.

next, the second object of the present invention, i.e., a means for producing a printed circuit board by the partly additive process by using the above photosensitive solder resist composition having a resistance to plating is described with reference to FIG. 1.

Through holes are board in a copper-clad laminate [FIG. 1, 1)] by a method known to those skilled in the art. Thereafter, a catalyst for electroless copper plating is applied on the whole surface including the inside wall of the through holes of the laminate [FIG. 1, 2)].

Then, predetermined portions of the laminate are etched by a method known to those skilled in the art, to form a conductor circuit on each side of the laminate [FIG. 1, 3)].

Subsequently, the photosensitive solder resist composition having a resistance to plating of the present invention is applied on one side of the laminate including the conductor circuit. The coated layer of the resist composition is dried and solidified. This procedure is repeated on the other side of the laminate. Alternatively, the photosensitive solder resist composition having a resistance to plating may be applied on both sides of the laminate at the same time and then dried. Thus, a solidified resist layer is formed on each side of the laminate. The drying temperature is usually 60° to 100° C. The drying time is preferably 0.2 to 2 hours.

Next, a negative mask is brought into close contact with each of the solidified resist layers on both sides of the laminate, and the resulting assembly is exposed to UV light casted at a dose of 0.1 to 1 $J/cm^2$ from both sides at the same time. Thereafter, the negative masks are peeled from the resist surfaces, and the unexposed portions are dissolved and removed by development. As a solvent suitable for the development, there is used a noncombustible chlorine-containing solvent such as 1,1,1-trichloroethane. The development time is chosen in the range of from 0.5 to 5 minutes.

Then, the laminate is heated to cure the resist portion forming a pattern. The curing conditions are chosen in the ranges of from 120° to 180° C. and 0.2 to 2 hours.

Preferably, the thus heat-cured resist may be again irradiated with UV light to accelerate the curing of the resist. An exposure dose suitable for such after exposure is 1 to 10 $J/cm^2$.

By the above steps, resist layers are formed on the laminate [FIG. 1, 4)].

Subsequently, the laminate is immersed in an electroless copper plating solution to form a thick electroless plated copper film on the very portions required to be plated such as the inside wall of the through holes, the surfaces of lands, etc. Thus, a printed circuit board is produced by the partly additive process [FIG. 1, 5)]. The thickness of the plated copper film is chosen usually in the range of from 10 to 40 μm. It is a highly important advantage of the present invention that the resist on the circuit copper foil is not peeled at all during such electroless copper plating.

In the above production of the printed circuit board by the partly additive process, the resist of the present invention can satisfy all of the above-mentioned requirements (a) to (m) at the same time. Therefore, it has become possible to produce a high-density printed circuit board by the partly additive process.

PREFERRED EMBODIMENTS OF THE INVENTION

The photosensitive solder resist composition having a resistance to plating of the present invention and the production of a printed circuit board by the use of the composition are explained below in detail. All of the photosensitive solder resist compositions used in the examples and comparative examples described hereinafter were produced in the following manner.

As the polyfunctional unsaturated compound which is solid at room temperature, i.e., one of the compounds used in the present invention, a diallyl phthalate resin was selected. It was weighed out and placed in a separable flask. An organic solvent was weighed out and was mixed therewith. Then, the resin was dissolved in the solvent with stirring at 80° to 100° C. for 30 minutes to 2 hours. The resulting solution was cooled to room temperature. Thereafter, the other materials for the resist were added thereto and thoroughly stirred to be mixed with the solution. Thereafter, the resulting mixture was kneaded 2 to 4 times with a triple roll mill to prepare a resist ink for screen printing.

In all of the examples and the comparative examples, printed circuit boards were produced in the following manner.

Through holes were bored at predetermined positions of a glass-epoxy double-sided copper-clad laminated board of 1.6 mm in thickness having copper foil of 35 μm in thickness of each side [FIG. 1, 1)] with a drill. Then a catalyst for electroless copper plating was applied on the whole surface including the inside wall of the through holes of the board [FIG. 1, 2)].

Then, predetermined portions were etched by the tenting method by the use of a dry film resist for etching to form a conductor circuit pattern on each side of the board [FIG. 1, 3)].

Next, the photosensitive solder resist ink prepared by the method described above was applied on one side including the conductor circuit of the board by screen printing. The board coated with the resist ink was dried to be solidified. This procedure was repeated on the other side of the board, whereby a solidified resist layer was formed on each side of the board. The drying temperature was 80° C. and the drying time 1 hour.

Subsequently, a negative mask was brought into close contact with each of the solidified resist layers on both sides of the board and exposed to UV light casted at a dose of 0.5 J/cm² from both sides at the same time. Thereafter, the negative masks were peeled from the resist layer surfaces. The unexposed portions were dissolved and removed by development. As a solvent for development, 1,1,1-trichloroethane was used. The development time was 1 minute.

Thereafter, the board was heated to cure the coated resist layer forming a pattern. The curing conditions were 150° C. for 1 hour.

In addition, the thus heat-cured resist was again irradiated with UV light at a dose of 3 J/cm² to accelerate the curing of the resist layer.

By the above steps, resist layers were formed on the board [FIG. 1, 4)].

Then, the board was immersed in an electroless copper plating solution to form a thick electroless plated copper film at the very portions required to be plated such as the inside wall of the through holes, the surface of lands, etc. [FIG. 1, 5)].

The electroless copper plating solution used had the composition shown below. As to the plating conditions, the bath temperature was 70° C., the pH of bath was 12.5, and the plating time was 15 hours. During the plating, the components of the plating solution were automatically supplied so as to keep the compositions of the plating solution and the plating conditions constant. The deposition potential was about −0.7 V (reference: saturated calomel electrode), and the thickness of the plated film was about 30 μm.

| Composition of the electroless copper plating solution | |
| --- | --- |
| CuSO₄.5H₂O | 12 g |
| EDTA.2Na | 42 g |
| 37% formaldehyde | 3 ml |
| NaOH | An amount for adjusting the pH to 12.5 |
| Ethoxy surfactant | 100 mg |
| 2,2'-Dipyridyl | 50 mg |
| Deionized water | A volume for making a total volume of 1 liter |

Characteristics of all of the photosensitive solder resist compositions having a resistance to plating of the present invention and the printed circuit boards obtained by using the compositions were examined with respect to the following items by the following test methods.

1) Coating Properties

Each resist is rated as satisfactory when the layer of the resist after screen printing does not contain a remaining void, air bubble or the like and has a smooth surface.

2) Close-contact Exposability

Each resist is exposed to UV light while bringing a negative mask into close contact with a resist surface. The resist is rated as satisfactory when it does not adhere to the negative mask at the time of peeling the negative mask after the exposure.

3) Developability

Development by spraying 1,1,1-trichloroethane is carried out at ordinary temperature for 1 minute. Each resist is rated as satisfactory when the unexposed portion is completely dissolved has the resist of the cured portion does not show any trouble such as swelling.

4) Resistance to Backside Curing

Each resist is applied on each side of a glass-epoxy laminate of 1.6 mm in thickness to a thickness of about 40 μm, dried, and then exposed to UV light casted at a dose of 0.5 J/cm$^2$ from one side. The resist is rated as satisfactory when the resist on the unexposed side has not been cured and is completely soluble when observed after development.

5) Alkali Resistance

Each resist is rated as satisfactory when none of dissolution, color change and roughening of the surface of the resist is observed after electroless copper plating.

6) Resistance to Plating Reaction

Each resist is rated as satisfactory when after electroless copper plating, peeling or color change is not observed in the resist which has been applied on a conductor circuit connected to a portion in which a copper plating layer has been deposited.

7) Resistance to Dissolution by Plating

A plated film of about 30 μm in thickness is formed using an electroless copper plating solution in such a volume that 1 dm$^2$ of each resist comes in contact with 1 liter of the solution. The resist is rated as satisfactory when this plating is not accompanied with abnormality in the crystalline orientation of deposited copper.

8 Heat Resistance

A flux for soldering is applied on a printed circuit board after electroless copper plating, after which the printed circuit board is immersed in a soldering bath at 260° C. for 10 seconds and then cooled to room temperature. This procedure is repeated 10 times. Each resist is rated as satisfactory when no trouble such as swelling or peeling is observed in the resist after the repeated procedure.

9) Insulating Properties

Each resist is applied on a comb pattern formed in accordance with JIS C 2519 on a glass-epoxy copper-clad laminate. The resist is rated as satisfactory when the insulation resistance of the resist in moistened state after electroless copper plating is Q or more.

EXAMPLE 1

Photosensitive solder resist compositions having a resistance to plating reaction of the present invention were prepared according to Table 1, and the above-mentioned characteristics 1) to 9) of the compositions were judged. Table 2 showed the results obtained.

As the polyfunctional unsaturated compound which is solid at room temperature, i.e., one of the compounds used in the present invention, there was used a diallyl phthalate resin (DAISO DAP A, mfd. by DAISO CO., LTD.; average molecular weight 10,000). As the polyfunctional unsaturated compound which is liquid at room temperature, pentaerythritol tetraacrylate was used. As the photopolymerization initiator, a mixture of benzophenone and 4,4'-bis(N,N'-dimethylamino)benzophenone was used. As the epoxy resin, a bisphenol A type epoxy resin, Epikote 828 (mfd. by Yuka Shell Epoxy K.K.) was used. As the curing agent for the epoxy resin, 2-phenylimidazole was used. As melamine and the derivatives thereof, each compound listed in Table 2 was added. As the defoaming agent, silicone oil SH-203 (mfd. by Toray Silicone Co., Ltd.) was used. As the pigment, phthalocyanine green was used. As the organic solvent, a mixture of ethyl cellosolve acetate and butyl cellosolve acetate was used.

As a result of production of printed circuit boards by the use of such resists, it was found that for making all the characteristics satisfactory, it is sufficient that a compound having in the molecule the structure of 2,4-diamino-s-triazine which is similar to that of melamine is used as melamine and derivatives thereof. It was also found that the amount of such a compound added is suitably 1 to 20 parts by weight per 100 parts by weight of the polyfunctional unsaturated compound which is solid at room temperature. The following was found. When the amount is less than 1 part by weight, the adhesive strength of the resist to a conductor circuit is not sufficient, namely, the resistance to plating reaction is not sufficient. When the amount exceeds 20 parts by weight, a slight amount of the excess melamine is dissolved in an electroless copper plating solution, resulting in abnormality in the crystalline orientation of deposited copper.

Figure 3:
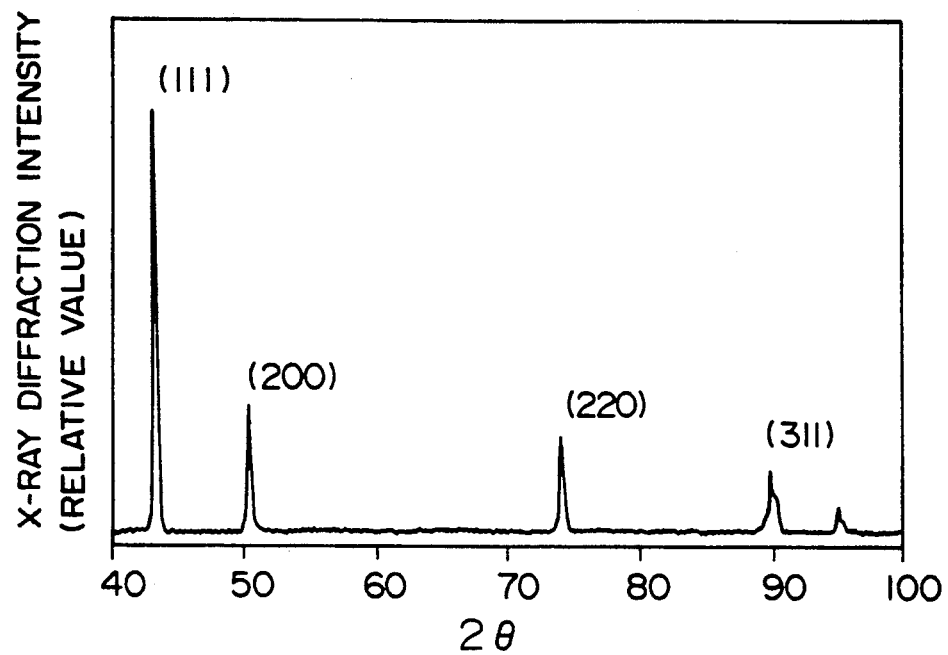
FIG. 3 is an X-ray diffraction pattern of a normal plated copper film obtained when a printed circuit board is produced by the partly additive process by using the photosensitive solder resist composition having a resistance to plating reaction of the present invention.
Figure 4:
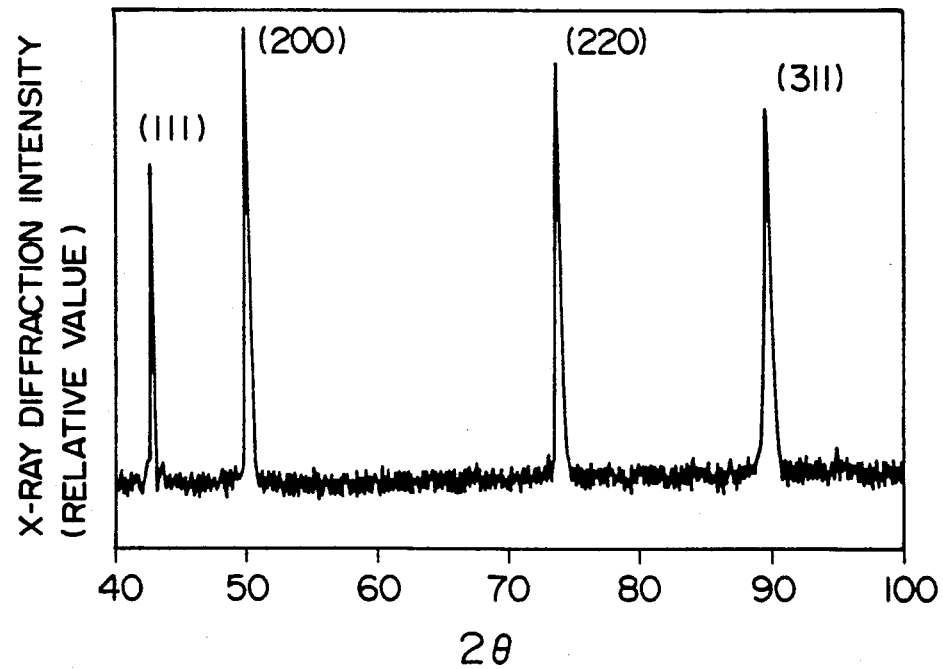
FIG. 4 is an X-ray diffraction pattern of an abnormal plated copper film obtained when a printed circuit board is produced by the partly additive process by using an unsuitable resist composition.

Whether the crystalline orientation of copper is normal or abnormal was judged according to the following criterion. The results of X-ray diffraction in these two cases are different as follows. In a normal plated copper film, orientation of (111) planes such as is shown in FIG. 3 precedes. On the other hand, in an abnormal plated copper film (200) planes are preferentially oriented as shown in FIG. 4. In some cases, such abnormality does not remarkably affect the mechanical properties such as tensile strength and elongation of a plated film. But, the abnormality causes cracking of copper-plated through holes during packaging on a printed circuit board by soldering, and hence should be prevented for attaining a high reliability of through holes.

From the results shown in Table 2, it was also found that a melamine derivative containing no 2,4-diamino-s-triazine skeleton in its structure does not give a sufficient resistance to plating reaction.

EXAMPLE 2

Photosensitive solder resist compositions having resistance to plating reaction of the present invention were prepared according to Table 3, and the above-mentioned characteristics 1) to 9) of the compositions were judged. Table 4 shows the results obtained.

In the present example, 3 parts by weight of melamine was used for assuring the resistance to plating reaction of the resist, and the effect of curing agents for epoxy resin was investigated. As is clear from Table 4, the suitable amount of 2-phenylimidazole was 0.1 to 5 parts by weight. When the amount of the curing agent was not sufficient, the alkali resistance in an electroless copper plating solution became insufficient because of insufficiency of the effect of the resist. When the amount was excessive, curing reaction proceeded during the drying of the resist, so that the unexposed portion was not completely dissolved by development.

It was also found that when the amount of the curing agent is adequate, substantially equal characteristics can be attained regardless of the kind of the curing agent.

EXAMPLE 3

Photosensitive solder resist compositions having a resistance to plating reaction of the present invention were prepared according to Table 5, and the abovementioned characteristics 1) to 9) of the compositions were judged. Table 6 shows the results obtained.

In the present example, there was investigated the effect of using a 2,4-diamino-s-triazine-modified imidazole containing in the molecule a 2,4-diamino-s-triazine ring and an imidazole ring enabling the modified imidazole to act as curing agent for the epoxy resin, for assuring the resistance to plating reaction of the resist. Such a compound is usually synthesized by the addition reaction of 2,4-diamino-6-vinyl-s-triazine with the active hydrogen of imidazole, and is commercially available from Shikoku Kasei Co., Ltd.

The photosensitive solder resists were prepared using each of a series of 2,4-diamino-s-triazine-moldified imidazoles, and the effect of these modified imidazoles were investigated to find that the modified imidazoles were effective when used in an amount of 1 to 20 parts by weight. It was also found that when their amount is less than 1 part by weight, the resistance to plating reaction is not sufficient, and that when the amount exceeds 20 parts by weight, the developability is deteriorated.

It was also found that the amount the 2,4-diamino-s-triazine-modified imidazole sufficient for curing the epoxy resin is not sufficient for assuring the resistance to plating reaction, and that for the assurance, the 2,4-diamino-s-triazine-modified imidazole is needed in an amount larger than that required for curing the epoxy resin.

Figure 5:
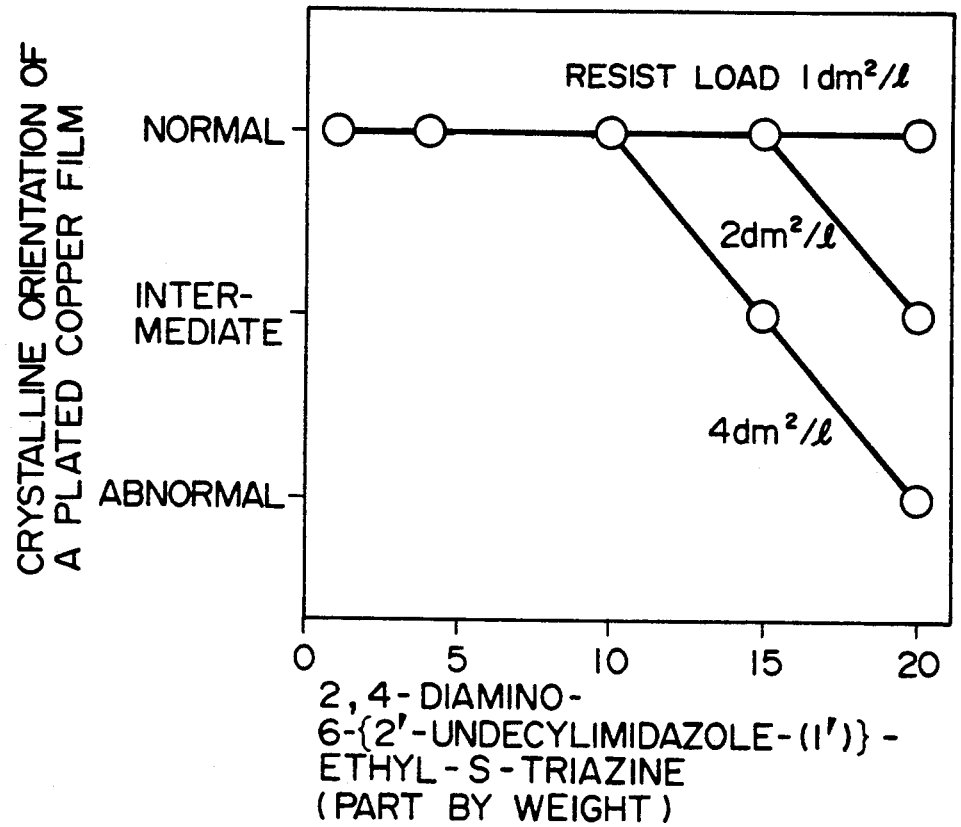
FIG. 5 is a graph obtained when the upper limit of the amount added of the melamine derivative used in the present invention was determined on the basis of the quality of a plated copper film.

In addition, using each of resists prepared according to the recipe shown in Table 5 by varying the amount of each 2,4-diamino-s-triazine-modified imidazole added, there was determined the relationship between the area of contact of the resist with a plating solution and the crystalline orientation of a plated film. FIG. 5 shows the results obtained.

When the load area of contact of the resist was 1 dm$^2$/liter, no abnormal deposition occurred even at 20 parts by weight. When the load area was 2 dm$^2$/liter, normal deposition took place at 15 parts by weight of less. When the load area exceeded 3 dm$^2$/liter, a somewhat abnormal (indicated by the word "INTERMEDIATE" in FIG. 5) copper plating layer was deposited at 15 parts by weight or less. When the load area was 4 dm$^2$/liter, normal deposition took place at 10 parts by weight or less. The fact that the upper limit of the amount added is thus affected by the resist load area indicates that the dissolution of the component added is not negligible though the amount of the component dissolved is very slight. It was also found that the upper limit of the amount added can be determined only experimentally.

The following was also found. The lower limit of the amount added depends on the relationship between the ranges of the curing temperature and curing time and the resistance to plating reaction. When the amount added is 2 parts by weight, ranges of the curing temperature and curing time in which a satisfactory resistance to plating reaction can be attained are wider than when the amount added is 1 part by weight. When the amount added is 4 parts by weight, the ranges become still wider. Such a characteristic is concerned with the yield of printed circuit boards in their mass production. The wider the ranges of the curing temperature and curing time becomes, the more stably and in the higher yield printed circuit boards can be mass-produced. Therefore, the wider the ranges the more preferable.

From the results described above, it was found that the amount of the 2,4-diamino-s-triazine-modified imidazole added is effective in the range of 1 to 20 parts by weight, and is preferably 2 to 15 parts by weight, more preferably 4 to 10 parts by weight.

EXAMPLE 4

Photosensitive solder resist compositions having a resistance to plating reaction of the present invention were prepared according to Table 7, and the action of melamine derivatives was further investigated in relation to the load of each resist in contact with a plating solution.

Figure 6:
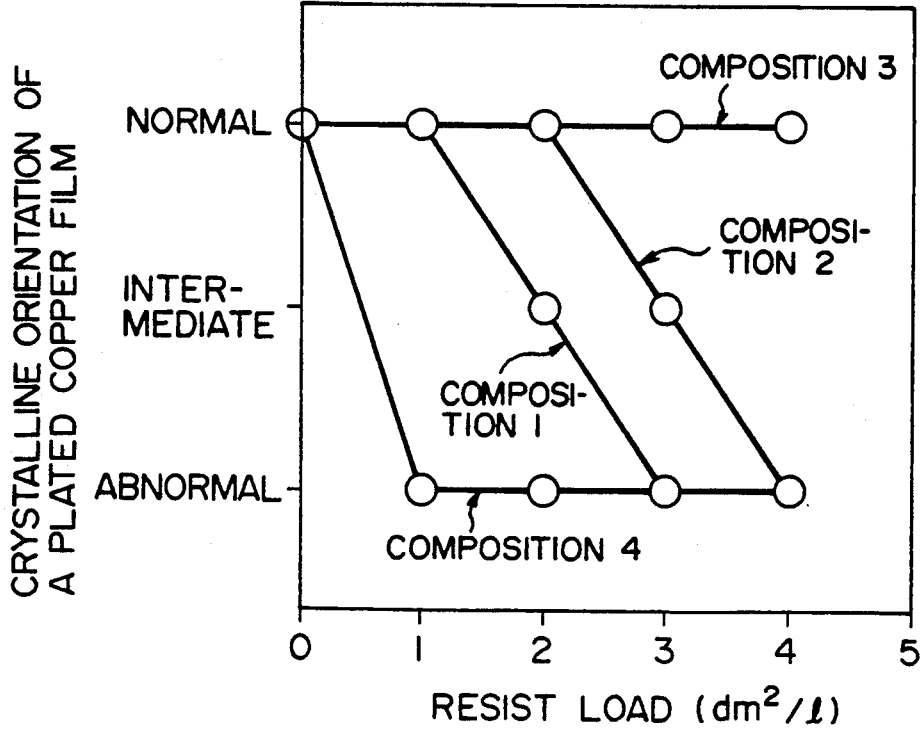
FIG. 6 is a graph obtained when the difference in quality among the melamine derivatives usable in the present invention was determined on the basis of the relationship between resist load and the quality of a plated copper film.

FIG. 6 shows the results obtained. When melamine was used as the melamine derivative, the crystalline orientation of copper became somewhat abnormal, resulting in cessation of the deposition of normal copper, at a resist load of 2 dm$^2$/liter or more. When 2,4-diamino-6-{2'-methylimidazole-(1')}ethyl-s-triazine was used, the crystalline orientation of copper became abnormal at a resist load of 3 dm$^2$/liter or more. When 2,4-diamino-6-{2'-undecylimidazole-(1')}ethyl-s-triazine was used crystalline orientation of copper did not become abnormal even at a resist load of 4 dm$^2$/liter. For comparison, in the case of a conventional resist containing dicyandiamide, the crystalline orientation of copper become abnormal even at a resist load of 1 dm$^2$/liter.

From these results, the following was found. When a melamine derivative is used, the higher its molecular weight and the lower its water-solubility, the more difficult the deposition of abnormal copper in plating at a high resist load. Therefore, the higher molecular weight and the lower water-solubility are the more preferable for the mass-production of printed circuit boards.

It was also found that the higher the water-solubility, the stronger the tendency of the melamine derivative to diffusion in the resist and dissolution in a plating solution. It was also found that in view of these facts, the water-solubility of the melamine derivative should be about 1 wt. % or less (which is substantially the same as that of melamine), preferably about 0.1 wt. % or less (which is substantially the same as that of 2,4-diamino-6-{2'-methylimidazole-(1')}ethyl-s-triazine), more preferably about 0.01 w % or less (which is substantially the same as that of 2,4-diamino-6-{2'-undecylimidazole-(1') ethyl-s-triazine and most preferably substantially insoluble in water. One of the reasons why dicyandiamine is not used in the present invention is that dicyandiamide has a water-solubility of as high as several per cent by weight or more and hence is easily soluble in a plating solution.

EXAMPLE 5

Photosensitive solder resist compositions having a resistance to plating reaction of the present invention were prepared according to Table 8, and the above-mentioned characteristics 1) to 9) of the compositions were judged. Table 9 shows the results obtained.

In the present example, there were investigated the effect of polyfunctional unsaturated compounds which are solid at room temperature, and the effect of the polyfunctional unsaturated compounds which are liquid at room temperature.

As shown in Table 9, as a result of comparing DAISO DAP A (molecular weight: 10,000), DAP L (molecular weight: 3,500) and ISODAP (molecular weight: 8,000) as the polyfunctional unsaturated compounds which are solid at room temperature, no marked difference was observed. All of them were found to be usable in the photosensitive solder resist having resistance to plating reaction.

On the other hand, there was made a comparison between the case of using each of bi-, tri-, tetra- and hexafunctional aliphatic unsaturated compounds and a bisphenol A type aromatic bifunctional acrylate as the polyfunctional unsaturated compound which is liquid at room temperature. It was found that as shown in Table 9, a resist satisfactory in all the characteristics can be obtained when the amount of the unsaturated compound added is 5 to 30 parts by weight, preferably 10 to 30 parts by weight, more preferably 10 to 20 parts by weight. The following was also found. When the amount added is not sufficient, crosslinking by exposure to light is not sufficient, so that the resist is swollen during development. When the amount added is excessive, the close-contact exposability is deteriorated.

In addition, it was found that the larger the number of functional groups of the unsaturated compound, the wider the suitable range of the added amount. It was also found that in view of this fact, the number of functional groups is preferably 2 or more, more preferably 3 or more, and that the hexafunctional aliphatic acrylate is the best.

EXAMPLE 6

Photosensitive solder resist compositions having a resistance to plating reaction of the present invention were prepared according to Table 10, and the above-mentioned characteristics 1) to 9) of the compositions were judged. Table 11 shows the results obtained.

In the present example, the influences of photopolymerization initiators, a UV absorber and a pigment on the characteristics of the photosensitive solder resists were investigated.

From the results shown in Table 11, it was found that the resists containing no pigment phthalocyanine green were not sufficient in resistance to backside curing because the permeability of the resists to UV light was too high. It was also found that for improving the resistance to backside curing, it is sufficient that a pigment such as phthalocyanine green which has UV-absorbing effect is added to the resist in an amount of about 0.2 part by weight or more.

In addition, it was found that suitable photopolymerization initiators are various radical-generating photopolymerization initiators, for example, benzophenone, 4,4'-bis(N,N'-diethylamino)benzophenone, 2-methyl-1-{4-(methylthio)phenyl}-2-morpholino-1-propane-1, benzoin alkyl ethers, thioxanthone derivatives, and dimethylaminobenzoic acid esters. It was also found that the most suitable amount of the photopolymerization initiator blended is approximately 2-12 parts by weight. When the amount of the photopolymerization initiator having UV-absorbing effect is not sufficient, the UV permeability of the resist is enhanced, so that the resistance to backside curing is deteriorated and that the alkali resistance of the resist is also deteriorated because of insufficiency of crosslinking by exposure to UV.

Furthermore, it was found that the UV-absorbing effect of the pigment and the photopolymerization initiator can be supplemented to a certain extent by addition of a UV absorber. That is, it was also found that even when the resist does not contain any pigment at all, the resistance to backside curing can be improved by adding a UV absorber such as 4-t-methoxybenzoylmethane to the resist.

EXAMPLE 7

Photosensitive solder resist compositions having a resistance to plating reaction of the present invention were prepared according to Table 12, and the above-mentioned characteristics 1 to 9) of the compositions were judged. Table 13 shows the results obtained.

In the present example, the influence of the kind and amount of epoxy resins on the characteristics of the resists was investigated. The resists were prepared using each of 4 compounds, i.e., two bisphenol A type epoxy resins, Epikote 828 and Epikote 1001, and two phenolic novolak type epoxy resins, Epikote 152 and Epikote 154. The characteristics of the resists were examined.

Table 13 shows the results obtained. It was found that satisfactory characteristics can be attained by the use of any of the resins. The following was also found. The most suitable amount of the resins blended is 5 to 40 parts by weight. When the amount is not sufficient, the resistance to plating reaction is not sufficient. When the amount is excessive, the close-contact exposability is deteriorated.

EXAMPLE 8

Photosensitive solder resist compositions having a resistance to plating reaction of the present invention were prepared according to Table 14, and the above-mentioned characteristics 1) to 9) of the compositions were judged. Table 15 shows the results obtained.

In the present example, the relationship between the amounts of a defoaming agent and organic solvent(s) blended and the characteristics was investigated.

As shown in Table 15, the amount of the defoaming agent such as silicone oil SH-203 is preferably 0.5 to 10 parts by weight. It was also found that when the amount is not sufficient, the defoaming during printing is not sufficient, resulting in unsatisfactory coating properties, and that when the amount is excessive, the close-contact exposability is deteriorated.

In addition, it was found that the amount of the organic solvents such as cellosolve acetates and Carbitols blended is suitably 50 to 100 parts by weight. It was also found that the amount of the organic solvent blended is not sufficient, the coating properties are deteriorated, and that when the amount is excessive the viscosity of resist ink becomes too low, resulting in difficult printing.

EXAMPLE 9

Printed circuit boards were produced by the partly additive process by using the photosensitive solder resist composition having a resistance to plating reaction of the present invention, and the limit of the density of wiring was determined. In detail, using a resist having the same composition as the composition 3 shows in Example 4, there were produced printed circuit boards various in density of wiring which has a line width of circuit of 0.2, 0.15, 0.1, 0.05 or 0.03 mm, respectively, and a diameter of through hole of 1, 0.7, 0.5, 0.3 or 0.2 mm, respectively. Consequently, it was found that according to the partly additive process, the printed circuit boards can be produced in substantially the same yield in spite of the above difference of the density of wiring. However, when the width of circuit was less than 0.03 mm, the insulation between circuit portions became insufficient. When the diameter of through hole was less than 0.2 mm, the processability was deteriorated.

On the other hand, when the same printed circuit boards various in density of wiring as described above were produced by the subtractive process, the yield dependent on etching for forming a circuit was lowered in the case where the line width of circuit was 0.15 mm or less, and the yield dependent on the uniformity of copper electroplating in through holes was lowered in the case where the diameter of through hole was 0.5 mm or less.

From these results, it was found that the present invention is particularly advantageous for producing a high-density printed circuit board having a line width of circuit of 0.15 mm or less and a diameter of through hole of 0.5 mm or less.

COMPARATIVE EXAMPLE

For comparison with the photosensitive solder resist compositions having a resistance to plating reaction of the present invention, conventional resists using dicyandiamide were prepared according to Table 16, and the above-mentioned characteristics 1) to 9) of the conventional resists were judged.

Table 17 shows the results obtained. As can be seen from Table 17, when the resist using dicyandiamide was used, a satisfactory resistance to plating reaction could be attained, but a copper plating layer having an abnormal crystalline orientation such as is shown in FIG. 4 was deposited, and the resistance to dissolution by plating was low. In a normal plated copper film, orientation of (111) planes such as is shown in FIG. 3 precedes. On the other hand, in an abnormal plated copper film, (200) planes are preferentially oriented as shown in FIG. 4. In some cases, such abnormality does not remarkably affect the mechanical properties such as tensile strength and elongation of a plated film. But the abnormality causes cracking of copper-plated through holes during packaging on a printed circuit board by soldering, and hence should be prevented for attaining a high reliability of through holes.

The abnormality was observed also when the amount of dicyandiamide blended is small, indicating that the employment of dicyandiamide is not suitable in itself.

As explained above in concrete, the photosensitive solder resist composition having a resistance to plating reaction of the present invention is excellent in coating properties, close-contact exposability, deveoability, resistance to backside curing, alkali resistance, resistance to plating reaction, resistance to dissolution by plating, heat resistance and insulating properties. Since the composition can satisfy the demand for all of these characteristics and hence can be used for producing a printed circuit board by the partly additive process, it permits production of a high-density printed circuit board of practical use by a simplified process.

TABLE 1

| Material | Composition (part by weight) |
| --- | --- |
| Diallyl phthalate resin | 100 |
| Pentaerythritol tetraacrylate | 20 |
| Benzophenone | 4 |
| 4,4'-Bis(N,N'-dimethylamino)benzophenone | 2 |
| Epikote 828 | 30 |
| 2-Phenylimidazole | 1 |
| Melamine derivative | Shown in Table 2 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 2

| Melamine derivative | Composition (part by weight) | | | | | | | | |
| --- | --- | --- | --- | --- | --- | --- | --- | --- | --- |
| Melamine | 0.5 | 1 | 5 | 10 | 20 | 30 | — | — | — |
| 2,4-Diamino-6-methyl-s-triazine | — | — | — | — | — | — | 2 | 5 | 10 |
| 2,4-Diamino-6-phenyl-s-triazine | — | — | — | — | — | — | — | — | — |
| 2,4-Diamino-6-hydroxy-s-triazine | — | — | — | — | — | — | — | — | — |
| 2-Amino-4,6-dihydroxy-s-triazine | — | — | — | — | — | — | — | — | — |
| Cyanuric chloride | — | — | — | — | — | — | — | — | — |
| Trichloromelamine | — | — | — | — | — | — | — | — | — |
| 3-Amino-5,6-dimethyl-1,2,4-triazine | — | — | — | — | — | — | — | — | — |
| Characteristics Coating property | Satisfactory | Satisfactory | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Satisfactory | Satisfactory | Satisfactory |
| Developability | Satisfactory | Satisfactory | Satisfactory | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory | Satisfactory | Satisfactory | Satisfactory |
| Resistance to plating reaction | Unsatisfactory | Satisfactory | Satisfactory | Satisfactory | Unsatisfactory | Satisfactory | Satisfactory | Satisfactory | Satisfactory |
| Resistance to dissolution by plating | — | Satisfactory | Satisfactory | Satisfactory | Satisfactory | Unsatisfactory | Satisfactory | Satisfactory | Satisfactory |
| Heat resistance | — | Satisfactory | Satisfactory | Satisfactory | Satisfactory | — | Satisfactory | Satisfactory | Satisfactory |
| Insulating property | — | Satisfactory | Satisfactory | Satisfactory | Satisfactory | — | Satisfactory | Satisfactory | Satisfactory |

| Melamine derivative | Composition (part by weight) | | | | | | | | |
| --- | --- | --- | --- | --- | --- | --- | --- | --- | --- |
| Melamine | — | — | — | — | — | — | — | — | — |
| 2,4-Diamino-6-methyl-s-triazine | — | — | — | — | — | — | — | — | — |
| 2,4-Diamino-6-phenyl-s-triazine | 2 | 5 | 10 | — | — | — | — | — | — |
| 2,4-Diamino-6-hydroxy-s-triazine | — | — | — | 2 | 5 | — | — | — | — |
| 2-Amino-4,6-dihydroxy-s-triazine | — | — | — | — | — | 5 | — | — | — |
| Cyanuric chloride | — | — | — | — | — | — | 5 | — | — |

TABLE 2-continued

| | | | | | | | | | |
|---|---|---|---|---|---|---|---|---|---|
| Trichloromelamine | — | — | — | — | — | — | — | 5 | — |
| 3-Amino-5,6-dimethyl-1,2,4-triazine | — | — | — | — | — | — | — | — | 5 |
| Characteristics | Coating property | Satisfactory | Satisfactory | Satisfactory | Satisfactory | Satisfactory | Satisfactory | Satisfactory | Satisfactory | Satisfactory |
| | Close-contact exposability | Satisfactory | Satisfactory | Satisfactory | Satisfactory | Satisfactory | Satisfactory | Satisfactory | Satisfactory | Satisfactory |
| | Developability | Satisfactory | Satisfactory | Satisfactory | Satisfactory | Satisfactory | Satisfactory | Satisfactory | Satisfactory | Satisfactory |
| | Resistance to backside curing | Satisfactory | Satisfactory | Satisfactory | Satisfactory | Satisfactory | Satisfactory | Satisfactory | Satisfactory | Satisfactory |
| | Alkali resistance | Satisfactory | Satisfactory | Satisfactory | Satisfactory | Satisfactory | Satisfactory | Satisfactory | Satisfactory | Satisfactory |
| | Resistance to plating reaction | Satisfactory | Satisfactory | Satisfactory | Satisfactory | Satisfactory | Unsatisfactory | Unsatisfactory | Unsatisfactory | Unsatisfactory |
| | Resistance to dissolution by plating | Unsatisfactory | Satisfactory | Satisfactory | Satisfactory | Satisfactory | — | — | — | — |
| | Heat resistance | Unsatisfactory | Satisfactory | Satisfactory | Satisfactory | Satisfactory | — | — | — | — |
| | Insulating property | Unsatisfactory | Satisfactory | Satisfactory | Satisfactory | Satisfactory | — | — | — | — |

TABLE 3

| Material | Composition (part by weight) |
|---|---|
| Diallyl phthalate resin | 100 |
| Pentaerythritol tetraacrylate | 20 |
| Benzophenone | 4 |
| 4,4'-Bis(N,N'-dimethylamino)benzophenone | 2 |
| Epikote 828 | 20 |
| Epoxy resin curing agent | Shown in Table 4 |
| Melamine | 3 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 4

| Epoxy resin curing agent | Composition (part by weight) | | | | | | | |
|---|---|---|---|---|---|---|---|---|
| 2-Phenylimidazole | 0.05 | 0.1 | 0.5 | 1 | 2 | 5 | 10 | — |
| 2-Methylimidazole | — | — | — | — | — | — | — | 0.5 |
| 2-Ethylimidazole | — | — | — | — | — | — | — | — |
| 2-Ethyl-4-methylimidazole | — | — | — | — | — | — | — | — |
| 1-(2-Cyanoethyl)-2-phenylimidazole | — | — | — | — | — | — | — | — |
| 4,4'-Diaminodiphenylmethane | — | — | — | — | — | — | — | — |
| 1-o-Tolylbiguanide | — | — | — | — | — | — | — | — |
| 2,4-Diamino-6-{2'-methylimidazole-(1')}-ethyl-s-triazine | — | — | — | — | — | — | — | — |
| Characteristics | Coating property | Satisfactory | Satisfactory | Satisfactory | Satisfactory | Satisfactory | Satisfactory | Satisfactory | Satisfactory |
| | Close-contact exposability | Satisfactory | Satisfactory | Satisfactory | Satisfactory | Satisfactory | Satisfactory | Satisfactory | Satisfactory |
| | Developability | Satisfactory | Satisfactory | Satisfactory | Satisfactory | Satisfactory | Satisfactory | Unsatisfactory | Satisfactory |
| | Resistance to backside curing | Satisfactory | Satisfactory | Satisfactory | Satisfactory | Satisfactory | Satisfactory | — | Satisfactory |
| | Alkali resistance | Unsatisfactory | Satisfactory | Satisfactory | Satisfactory | Satisfactory | Satisfactory | — | Satisfactory |
| | Resistance to plating reaction | — | Satisfactory | Satisfactory | Satisfactory | Satisfactory | Satisfactory | — | Satisfactory |
| | Resistance to dissolution by plating | — | Satisfactory | Satisfactory | Satisfactory | Satisfactory | Satisfactory | — | Satisfactory |
| | Heat resistance | — | Satisfactory | Satisfactory | Satisfactory | Satisfactory | Satisfactory | — | Satisfactory |
| | Insulating property | — | Satisfactory | Satisfactory | Satisfactory | Satisfactory | Satisfactory | — | Satisfactory |
| Epoxy resin curing agent | Composition (part by weight) | | | | | | | |
| 2-Phenylimidazole | — | — | — | — | — | — | — | — |
| 2-Methylimidazole | 1 | — | — | — | — | — | — | — |
| 2-Ethylimidazole | — | 1 | — | — | — | — | — | — |
| 2-Ethyl-4-methylimidazole | — | — | 1 | — | — | — | — | — |
| 1-(2-Cyanoethyl)-2-phenylimidazole | — | — | — | 1 | — | — | — | — |
| 4,4'-Diaminodiphenylmethane | — | — | — | — | 2 | — | — | — |
| 1-o-Tolylbiguanide | — | — | — | — | — | 2 | — | — |
| 2,4-Diamino-6-{2'-methylimidazole-(1')}-ethyl-s-triazine | — | — | — | — | — | — | 0.5 | 1 |
| Characteristics | Coating property | Satisfactory | Satisfactory | Satisfactory | Satisfactory | Satisfactory | Satisfactory | Satisfactory | Satisfactory |
| | Close-contact exposability | Satisfactory | Satisfactory | Satisfactory | Satisfactory | Satisfactory | Satisfactory | Satisfactory | Satisfactory |

TABLE 4-continued

| | | | | | | | | |
|---|---|---|---|---|---|---|---|---|
| Developability | Satisfactory | Satisfactory | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory | Satisfactory | Satisfactory |
| Resistance to plating reaction | Satisfactory | Satisfactory | Satisfactory | Satisfactory | Satisfactory | Satisfactory | Satisfactory | Satisfactory |
| Resistance to dissolution by plating | Satisfactory | Satisfactory | Satisfactory | Satisfactory | Satisfactory | Satisfactory | Satisfactory | Satisfactory |
| Heat resistance | Satisfactory | Satisfactory | Satisfactory | Satisfactory | Satisfactory | Satisfactory | Satisfactory | Satisfactory |
| Insulating property | Satisfactory | Satisfactory | Satisfactory | Satisfactory | Satisfactory | Satisfactory | Satisfactory | Satisfactory |

TABLE 5

| Material | Composition (part by weight) |
|---|---|
| Diallyl phthalate resin | 100 |
| Pentaerythritol tetraacrylate | 20 |
| Benzophenone | 4 |
| 4,4'-Bis(N,N'-dimethylamino)benzophenone | 2 |
| Epikote 828 | 30 |
| Epoxy resin curing agent and concurrent melamine derivative | Shown in Table 6 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 6

| Epoxy resin curring agent | Composition (part by weight) | | | | | | | | |
|---|---|---|---|---|---|---|---|---|---|
| 2,4-Diamino-6-{2'-methyl-imidazole-(1')}ethyl-s-triazine | 0.5 | 1 | 2 | 4 | 10 | 20 | 30 | — | — |
| 2,4-Diamino-6-{2'-ethyl-4'-methylimidazole-(1')}ethyl-2-triazine | — | — | — | — | — | — | — | 4 | 10 |
| 2,4-Diamino-6-{2'-undecyl-imidazole-(1')}ethyl-s-triazine | — | — | — | — | — | — | — | — | — |
| 2,4-Diamino-6-{2'-phenyl-imidazole-(1')}ethyl-s-triazine | — | — | — | — | — | — | — | — | — |
| 2,4-Diamino-6-{2'-methyl-imidazole-(1')}ethyl-s-triazine/isocyanuric acid adduct | — | — | — | — | — | — | — | — | — |
| Characteristics — Coating property | Satisfactory | Satisfactory | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Satisfactory | Satisfactory | Satisfactory |
| Developability | Satisfactory | Satisfactory | Satisfactory | Satisfactory | Satisfactory | Satisfactory | Unsatisfactory | Satisfactory | Satisfactory |
| Resistance to backside curing | Satisfactory | Satisfactory | Satisfactory | Satisfactory | Satisfactory | Satisfactory | — | Satisfactory | Satisfactory |
| Alkali resistance | Satisfactory | Satisfactory | Satisfactory | Satisfactory | Satisfactory | Satisfactory | — | Satisfactory | Satisfactory |
| Resistance to plating reaction | Unsatisfactory | Satisfactory | Satisfactory | Satisfactory | Satisfactory | Satisfactory | — | Satisfactory | Satisfactory |
| Resistance to dissolution by plating | — | Satisfactory | Satisfactory | Satisfactory | Satisfactory | Satisfactory | — | Satisfactory | Satisfactory |
| Heat resistance | — | Satisfactory | Satisfactory | Satisfactory | Satisfactory | Satisfactory | — | Satisfactory | Satisfactory |
| Insulating property | — | Satisfactory | Satisfactory | Satisfactory | Satisfactory | Satisfactory | — | Satisfactory | Satisfactory |

| Epoxy resin curring agent | Composition (part by weight) | | | | | | | |
|---|---|---|---|---|---|---|---|---|
| 2,4-Diamino-6-{2'-methyl-imidazole-(1')}ethyl-s-triazine | — | — | — | — | — | — | — | — |
| 2,4-Diamino-6-{2'-ethyl-4'-methylimidazole-(1')}ethyl-2-triazine | 20 | — | — | — | — | — | — | — |
| 2,4-Diamino-6-{2'-undecyl-imidazole-(1')}ethyl-s-triazine | — | 5 | 10 | 15 | — | — | — | — |
| 2,4-Diamino-6-{2'-phenyl-imidazole-(1')}ethyl-s-triazine | — | — | — | — | 5 | 10 | 15 | — |
| 2,4-Diamino-6-{2'-methyl-imidazole-(1')}ethyl-s-triazine/isocyanuric acid adduct | — | — | — | — | — | — | 5 | 10 |
| Characteristics — Coating property | Satisfactory | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Satisfactory | Satisfactory |

TABLE 6-continued

| | | | | | | | | | |
|---|---|---|---|---|---|---|---|---|---|
| Developability | Satisfactory | Satisfactory | Satisfactory | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory | Satisfactory | Satisfactory | Satisfactory |
| Resistance to plating reaction | Satisfactory | Satisfactory | Satisfactory | Satisfactory | Satisfactory | Satisfactory | Satisfactory | Satisfactory | Satisfactory |
| Resistance to dissolution by plating | Unsatisfactory | Satisfactory | Satisfactory | Satisfactory | Satisfactory | Satisfactory | Satisfactory | Satisfactory | Satisfactory |
| Heat resistance | Satisfactory | Satisfactory | Satisfactory | Satisfactory | Satisfactory | Satisfactory | Satisfactory | Satisfactory | Satisfactory |
| Insulating property | Satisfactory | Satisfactory | Satisfactory | Satisfactory | Satisfactory | Satisfactory | Satisfactory | Satisfactory | Satisfactory |

TABLE 7

| Material | Composition 1 (part by weight) | Composition 2 (part by weight) | Composition 3 (part by weight) | Composition 4 (part by weight) |
|---|---|---|---|---|
| Diallyl phthalate resin | 100 | 100 | 100 | 100 |
| Pentaerythritol tetraacrylate | 20 | 20 | 20 | 20 |
| Benzophenone | 4 | 4 | 4 | 4 |
| 4,4'-Bis(N,N'-dimethylamino)benzophenone | 2 | 2 | 2 | 2 |
| Epikote 828 | 30 | 30 | 30 | 30 |
| Melamine | 4 | — | — | — |
| 2,4-Diamino-6-{2'-methyl imidazole-(1')}ethyl-s-triazine | — | 4 | — | — |
| 2,4-Diamino-6-{2'-undecyl-imidazole-(1')}ethyl-s-triazine | — | — | 4 | — |
| Dicyandiamide | — | — | — | 4 |
| 2-Phenylimidazole | 1 | — | — | 1 |
| Silicone oil SH-203 | 5 | 5 | 5 | 5 |
| Aerosil A-380* | 4 | 4 | 4 | 4 |
| Phthalocyanine green | 2 | 2 | 2 | 2 |
| Ethyl cellosolve acetate | 35 | 35 | 35 | 35 |
| Butyl cellosolve acetate | 35 | 35 | 35 | 35 |

*mfd. by Nippon Aerosil Co., Ltd.

TABLE 8

| Material | Composition (part by weight) |
|---|---|
| Solid unsaturate compound | Shown in Table 9 |
| Liquid unsaturated compound | Shown in Table 9 |
| 2-Methyl-1-{4-(methylthio)phenyl}-2-morpholino-propane | 4 |
| 4,4'-Bis(N,N'-dimethylamino)benzophenone | 2 |
| Epikote 828 | 30 |
| 2-Phenylimidazole | 1 |
| Melamine | 5 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 9

| | Unsaturated compound | Composition (part by weight) | | | | | | | | |
|---|---|---|---|---|---|---|---|---|---|---|
| Solid | DAISO DAP A | 100 | — | — | 100 | 100 | 100 | 100 | 100 | 100 |
| | DAISO DAP L | — | 100 | — | — | — | — | — | — | — |
| | DAISO ISODAP | — | — | 100 | — | — | — | — | — | — |
| Liquid | Diethylene glycol diacrylate | — | — | — | 5 | 10 | 20 | 30 | — | — |
| | Trimethylolpropane triacrylate | — | — | — | — | — | — | — | 5 | 10 |
| | Pentaerythritol tetramethacrylate | — | — | — | — | — | — | — | — | — |
| | Dipentaerythritol hexacrylate | 10 | 20 | 20 | — | — | — | — | — | — |
| | Bisphenol A type epoxyacrylate | — | — | — | — | — | — | — | — | — |
| Characteristics | Coating property | Satisfactory | Satisfactory | Satisfactory | Satisfactory | Satisfactory | Satisfactory | Satisfactory | Satisfactory | Satisfactory |
| | Close-contact exposability | Satisfactory | Satisfactory | Satisfactory | Satisfactory | Satisfactory | Satisfactory | Unsatisfactory | Satisfactory | Satisfactory |
| | Developability | Satisfactory | Satisfactory | Satisfactory | Unsatisfactory | Satisfactory | Satisfactory | — | Satisfactory | Satisfactory |

TABLE 9-continued

|  | | | | | | | | | | |
|---|---|---|---|---|---|---|---|---|---|---|
| | Resistance to backside curing | Satisfactory | Satisfactory | Satisfactory | — | Satisfactory | Satisfactory | — | Satisfactory | Satisfactory |
| | Alkali resistance | Satisfactory | Satisfactory | Satisfactory | — | Satisfactory | Satisfactory | — | Satisfactory | Satisfactory |
| | Resistance to plating reaction | Satisfactory | Satisfactory | Satisfactory | — | Satisfactory | Satisfactory | — | Satisfactory | Satisfactory |
| | Resistance to dissolution by plating | Satisfactory | Satisfactory | Satisfactory | — | Satisfactory | Satisfactory | — | Satisfactory | Satisfactory |
| | Heat resistance | Satisfactory | Satisfactory | Satisfactory | — | Unsatisfactory | Satisfactory | — | Unsatisfactory | Satisfactory |
| | Insulating property | Satisfactory | Satisfactory | Satisfactory | — | — | Satisfactory | — | — | Satisfactory |

| Unsaturated compound | | Composition (part by weight) | | | | | | | | |
|---|---|---|---|---|---|---|---|---|---|---|
| Solid | DAISO DAP A | 100 | 100 | 100 | 100 | 100 | 100 | 100 | 100 | 100 |
| | DAISO DAP L | — | — | — | — | — | — | — | — | — |
| | DAISO ISODAP | — | — | — | — | — | — | — | — | — |
| Liquid | Diethylene glycol diacrylate | — | — | — | — | — | — | — | — | — |
| | Trimethylolpropane triacrylate | 20 | 30 | — | — | — | — | — | — | — |
| | Pentaerythritol tetramethacrylate | — | — | 10 | 20 | 30 | — | — | — | — |
| | Dipentaerythritol hexacrylate | — | — | — | — | — | 5 | 30 | 40 | — |
| | Bisphenol A type epoxyacrylate | — | — | — | — | — | — | — | — | 20 |
| Characteristics | Coating property | Satisfactory | Satisfactory | Satisfactory | Satisfactory | Satisfactory | Satisfactory | Satisfactory | Satisfactory | Satisfactory |
| | Close-contact exposability | Satisfactory | Unsatisfactory | Satisfactory | Satisfactory | Unsatisfactory | Satisfactory | Satisfactory | Unsatisfactory | Satisfactory |
| | Developability | Satisfactory | — | Satisfactory | Satisfactory | — | Satisfactory | Satisfactory | — | Satisfactory |
| | Resistance to backside curing | Satisfactory | — | Satisfactory | Satisfactory | — | Satisfactory | Satisfactory | — | Satisfactory |
| | Alkali resistance | Satisfactory | — | Satisfactory | Satisfactory | — | Satisfactory | Satisfactory | — | Satisfactory |
| | Resistance to plating reaction | Satisfactory | — | Satisfactory | Satisfactory | — | Satisfactory | Satisfactory | — | Satisfactory |
| | Resistance to dissolution by plating | Satisfactory | — | Satisfactory | Satisfactory | — | Satisfactory | Satisfactory | — | Satisfactory |
| | Heat resistance | Satisfactory | — | Satisfactory | Satisfactory | — | Satisfactory | Satisfactory | — | Satisfactory |
| | Insulating property | Satisfactory | — | Satisfactory | Satisfactory | — | Satisfactory | Satisfactory | — | Satisfactory |

TABLE 10

| Material | Composition (part by weight) |
|---|---|
| Diallyl phthalate resin | 100 |
| Dipentaerythritol hexaacrylate | 20 |
| Photopolymeriazation initiator | Shown in Table 11 |
| UV absorber | Shown in Table 11 |
| Epikote 828 | 30 |
| 2-Phenylimidazole | 1 |
| Melamine | 5 |
| Silicone oil SH-203 | 5 |
| Aerosil A-380* | 4 |
| Phthalocyanine green | Shown in Table 11 |
| Ethyl cellosolve acetate | 35 |
| Butyl cellosolve acetate | 35 |

*mfd. by Nippon Aerosil Co., Ltd.

TABLE 11

| Initiator/absorber/pigment | | Composition (part by weight) | | | | | | | | |
|---|---|---|---|---|---|---|---|---|---|---|
| Benzophenone | | 4 | 4 | 4 | 4 | — | — | — | — | — |
| 4,4'-Bis(N,N'-diethylamino)-benzophenone | | 2 | 2 | 2 | 2 | 2 | 2 | 1 | 1 | 0.5 |
| 2-Methyl-1-{4-(methylthio)-phenyl}-2-morpholino-1-propane-1 | | — | — | — | — | 1 | 1 | 2 | 1 | 4 |
| Benzoin butyl ether | | — | — | — | — | — | — | — | — | — |
| 2,4-Diethylthioxanthone | | — | — | — | — | — | — | — | — | — |
| Ethyl p-dimethylaminobenzoate | | — | — | — | — | — | — | — | — | — |
| 4-t-Butyl-methoxybenzoylmethane | | — | — | — | — | — | — | — | — | — |
| Phthalocyanine green | | — | 0.2 | 2 | 10 | — | 0.5 | 0.5 | 0.5 | 2 |
| Characteristics | Coating property | Satisfactory | Satisfactory | Satisfactory | Satisfactory | Satisfactory | Satisfactory | Satisfactory | Satisfactory | Satisfactory |
| | Close-contact exposability | Satisfactory | Satisfactory | Satisfactory | Satisfactory | Satisfactory | Satisfactory | Satisfactory | Satisfactory | Satisfactory |
| | Developability | Satis- | Satis- | Satis- | Satis- | Satis- | Satis- | Satis- | Satis- | Satis- |

TABLE 11-continued

|  | factory | factory | factory | factory | factory | factory | factory | factory | factory |
|---|---|---|---|---|---|---|---|---|---|
| Resistance to backside curing | Unsatisfactory | Satisfactory | Satisfactory | Satisfactory | Unsatisfactory | Satisfactory | Satisfactory | Satisfactory | Satisfactory |
| Alkali resistance | — | Satisfactory | Satisfactory | Satisfactory | — | Satisfactory | Satisfactory | Satisfactory | Satisfactory |
| Resistance to plating reaction | — | Satisfactory | Satisfactory | Satisfactory | — | Satisfactory | Satisfactory | Satisfactory | Satisfactory |
| Resistance to dissolution by plating | — | Satisfactory | Satisfactory | Satisfactory | — | Satisfactory | Satisfactory | Satisfactory | Satisfactory |
| Heat resistance | — | Satisfactory | Satisfactory | Satisfactory | — | Satisfactory | Satisfactory | Satisfactory | Satisfactory |
| Insulating property | — | Satisfactory | Satisfactory | Satisfactory | — | Satisfactory | Satisfactory | Satisfactory | Satisfactory |

| Initiator/absorber/pigment | Composition (part by weight) | | | | | | | |
|---|---|---|---|---|---|---|---|---|
| Benzophenone | — | — | — | — | — | 4 | 4 | 4 |
| 4,4'-Bis(N,N'-diethylamino)-benzophenone | 4 | 3 | — | — | — | 2 | 2 | 2 |
| 2-Methyl-1-{4-(methylthio)-phenyl}-2-morpholino-1-propane-1 | 8 | 3 | — | — | — | — | — | — |
| Benzoin butyl ether | — | — | 4 | — | — | — | — | — |
| 2,4-Diethylthioxanthone | — | — | — | 4 | 2 | — | — | — |
| Ethyl p-dimethylaminobenzoate | — | — | — | 2 | 4 | — | — | — |
| 4-t-Butyl-methoxybenzoyl-methane | — | — | — | — | — | 0.05 | 0.1 | 0.2 |
| Phthalocyanine green | 1 | 0.5 | 1 | 2 | 2 | — | — | — |
| Characteristics Coating property | Satisfactory | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Satisfactory | Satisfactory |
| Developability | Satisfactory | Satisfactory | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory | Satisfactory | Satisfactory |
| Resistance to plating reaction | Satisfactory | Satisfactory | Satisfactory | Satisfactory | Satisfactory | Satisfactory | Satisfactory | Satisfactory |
| Resistance to dissolution by plating | Unsatisfactory | Satisfactory | Satisfactory | Satisfactory | Satisfactory | Satisfactory | Satisfactory | Satisfactory |
| Heat resistance | Satisfactory | Satisfactory | Satisfactory | Satisfactory | Satisfactory | Satisfactory | Satisfactory | Satisfactory |
| Insulating property | Satisfactory | Satisfactory | Satisfactory | Satisfactory | Satisfactory | Satisfactory | Satisfactory | Satisfactory |

TABLE 12

| Material | Composition (part by weight) |
|---|---|
| Diallyl phthalate resin | 100 |
| Pentaerythritol tetraacrylate | 20 |
| 2-Methyl-1-{4-(methylthio)-phenyl}2-morpholino-1-propane-1 | 4 |
| 4,4'-Bis(N,N'-dimethyl-amino)benzophenone | 2 |
| Epoxy resin | Shown in Table 13 |
| Curing agent and concurrently melamine derivative | Shown in Table 13 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 13

| Epoxy resin/curing agent | Composition (part by weight) | | | | | | | | |
|---|---|---|---|---|---|---|---|---|---|
| Epikote 828 | 1 | 5 | 10 | 20 | 30 | 40 | 50 | — | — |
| Epikote 1001 | — | — | — | — | — | — | — | 10 | 20 |
| Epikote 152 | — | — | — | — | — | — | — | — | — |
| Epikote 154 | — | — | — | — | — | — | — | — | — |
| 2,4-Diamino-6-{2'-undecyl-imidazole-(1')}ethyl-s-triazine | 10 | 10 | 10 | 10 | 10 | 10 | 10 | 10 | 10 |
| Characteristics Coating property | Satisfactory | Satisfactory | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Unsatisfactory | Satisfactory | Satisfactory |
| Developability | Satisfactory | Satisfactory | Satisfactory | Satisfactory | Satisfactory | Satisfactory | — | Satisfactory | Satisfactory |
| Resistance to backside curing | Satisfactory | Satisfactory | Satisfactory | Satisfactory | Satisfactory | Satisfactory | — | Satisfactory | Satisfactory |
| Alkali resistance | Satis- | Satis- | Satis- | Satis- | Satis- | Satis- | — | Satis- | Satis- |

TABLE 13-continued

|  |  |  |  |  |  |  |  |  |  |
|---|---|---|---|---|---|---|---|---|---|
|  | Resistance to plating reaction | factory Unsatisfactory | factory Satisfactory | factory Satisfactory | factory Satisfactory | factory Satisfactory | factory Satisfactory | factory Satisfactory | factory Satisfactory |
|  | Resistance to dissolution by plating | — | Satisfactory | Satisfactory | Satisfactory | Satisfactory | Satisfactory | — | Satisfactory | Satisfactory |
|  | Heat resistance | — | Satisfactory | Satisfactory | Satisfactory | Satisfactory | Satisfactory | — | Satisfactory | Satisfactory |
|  | Insulating property | — | Satisfactory | Satisfactory | Satisfactory | Satisfactory | Satisfactory | — | Satisfactory | Satisfactory |

| Epoxy resin/curing agent | Composition (part by weight) | | | | | | | | |
|---|---|---|---|---|---|---|---|---|---|
| Epikote 828 | — | — | — | — | — | — | — | — | — |
| Epikote 1001 | — | — | — | — | — | — | — | — | — |
| Epikote 152 | 1 | 5 | 10 | 20 | 30 | 40 | 50 | — | — |
| Epikote 154 | — | — | — | — | — | — | — | 10 | 20 |
| 2,4-Diamino-6-{2'-undecyl-imidazole-(1')}ethyl-s-triazine | 5 | 5 | 5 | 5 | 5 | 5 | 5 | 5 | 5 |
| Characteristics | Coating property | Satisfactory | Satisfactory | Satisfactory | Satisfactory | Satisfactory | Satisfactory | Satisfactory | Satisfactory | Satisfactory |
|  | Close-contact exposability | Satisfactory | Satisfactory | Satisfactory | Satisfactory | Satisfactory | Satisfactory | Unsatisfactory | Satisfactory | Satisfactory |
|  | Developability | Satisfactory | Satisfactory | Satisfactory | Satisfactory | Satisfactory | Satisfactory | — | Satisfactory | Satisfactory |
|  | Resistance to backside curing | Satisfactory | Satisfactory | Satisfactory | Satisfactory | Satisfactory | Satisfactory | — | Satisfactory | Satisfactory |
|  | Alkali resistance | Satisfactory | Satisfactory | Satisfactory | Satisfactory | Satisfactory | Satisfactory | — | Satisfactory | Satisfactory |
|  | Resistance to plating reaction | Unsatisfactory | Satisfactory | Satisfactory | Satisfactory | Satisfactory | Satisfactory | — | Satisfactory | Satisfactory |
|  | Resistance to dissolution by plating | — | Satisfactory | Satisfactory | Satisfactory | Satisfactory | Satisfactory | — | Satisfactory | Satisfactory |
|  | Heat resistance | — | Satisfactory | Satisfactory | Satisfactory | Satisfactory | Satisfactory | — | Satisfactory | Satisfactory |
|  | Insulating property | — | Satisfactory | Satisfactory | Satisfactory | Satisfactory | Satisfactory | — | Satisfactory | Satisfactory |

TABLE 14

| Material | Composition (part by weight) |
|---|---|
| Diallyl phthalate resin | 100 |
| Pentaerythritol tetraacrylate | 20 |
| Benzophenone | 4 |
| 4,4'-Bis(N,N'-dimethylamino)benzophenone | 2 |
| Epikote 828 | 30 |
| 2-Phenylimidazole | 1 |
| Melamine | 5 |
| Aerosil A-380* | 4 |
| Phthalocyanine green | 2 |
| Deforming agent | Shown in Table 15 |
| Organic solvent | Shown in Table 15 |

*mfd. by Nippon Aerosil Co., Ltd.

TABLE 15

| Deforming agent/organic solvent | Composition (part by weight) | | | | | | | | |
|---|---|---|---|---|---|---|---|---|---|
| Silicone SH-203 | 0.1 | 0.1 | 2 | 5 | 10 | 20 | 5 | 5 | 5 |
| Ethyl cellosolve acetate | 35 | 35 | 35 | 35 | 35 | 35 | 40 | 50 | 70 |
| Butyl cellosolve acetate | 35 | 35 | 35 | 35 | 35 | 35 | — | — | — |
| Ethyl carbitol | — | — | — | — | — | — | — | — | — |
| Butyl carbitol | — | — | — | — | — | — | — | — | — |
| Characteristics | Coating property | Unsatisfactory | Satisfactory | Satisfactory | Satisfactory | Satisfactory | Satisfactory | Unsatisfactory | Satisfactory | Satisfactory |
|  | Close-contact exposability | — | Satisfactory | Satisfactory | Satisfactory | Satisfactory | Unsatisfactory | — | Satisfactory | Satisfactory |
|  | Developability | — | Satisfactory | Satisfactory | Satisfactory | Satisfactory | — | — | Satisfactory | Satisfactory |
|  | Resistance to backside curing | — | Satisfactory | Satisfactory | Satisfactory | Satisfactory | — | — | Satisfactory | Satisfactory |
|  | Alkali resistance | — | Satisfactory | Satisfactory | Satisfactory | Satisfactory | — | — | Satisfactory | Satisfactory |
|  | Resistance to plating reaction | — | Satisfactory | Satisfactory | Satisfactory | Satisfactory | — | — | Satisfactory | Satisfactory |
|  | Resistance to dissolution by plating | — | Satisfactory | Satisfactory | Satisfactory | Satisfactory | — | — | Satisfactory | Satisfactory |
|  | Heat resistance | — | Satisfactory | Satisfactory | Satisfactory | Satisfactory | — | — | Satisfactory | Satisfactory |
|  | Insulating property | — | Satisfactory | Satisfactory | Satisfactory | Satisfactory | — | — | Satisfactory | Satisfactory |

| Deforming agent/organic solvent | Composition (part by weight) | | | | | | | |
|---|---|---|---|---|---|---|---|---|
| Silicone SH-203 | 5 | 5 | 5 | 5 | 5 | 5 | 5 | 5 |
| Ethyl cellosolve acetate | 100 | 120 | — | — | — | — | — | — |

TABLE 15-continued

| | | | | | | | | |
|---|---|---|---|---|---|---|---|---|
| Buty cellosolve acetate | — | — | 35 | 70 | 120 | — | — | — |
| Ethyl carbitol | — | — | — | — | — | 20 | 35 | 50 |
| Butyl carbitol | — | — | — | — | — | 20 | 35 | 50 |
| Characteristics — Coating property | Satisfactory | Unsatisfactory | Unsatisfactory | Satisfactory | Unsatisfactory | Unsatisfactory | Satisfactory | Satisfactory |
| Close-contact exposability | Satisfactory | — | — | Satisfactory | — | — | Satisfactory | Satisfactory |
| Developability | Satisfactory | — | — | Satisfactory | — | — | Satisfactory | Satisfactory |
| Resistance to backside curing | Satisfactory | — | Satisfactory | Satisfactory | — | — | Satisfactory | Satisfactory |
| Alkali resistance | Satisfactory | — | Satisfactory | Satisfactory | — | — | Satisfactory | Satisfactory |
| Resistance to plating reaction | Satisfactory | — | Satisfactory | Satisfactory | — | — | Satisfactory | Satisfactory |
| Resistance to dissolution by plating | Satisfactory | — | Satisfactory | Satisfactory | — | — | Satisfactory | Satisfactory |
| Heat resistance | Satisfactory | — | Satisfactory | Satisfactory | — | — | Satisfactory | Satisfactory |
| Insulating property | Satisfactory | — | Satisfactory | Satisfactory | — | — | Satisfactory | Satisfactory |

TABLE 16

| Material | Composition (part by weight) |
|---|---|
| Diallyl phthalate resin | 100 |
| Pentaerythritol tetraacrylate | 20 |
| Benzophenone | 4 |
| 4,4'-Bis(N,N'-dimethylamino)benzophenone | 2 |
| Epikote 828 | 30 |
| Epoxy resin curing agent | Shown in Table 17 |
| Dicyandiamide | Shown in Table 17 |
| Silicone oil SH-203 | 5 |
| Aerosil A-380* | 4 |
| Phthalocyanine green | 2 |
| Ethyl cellosolve acetate | 35 |
| Butyl cellosolve acetate | 35 |

*mfd. by Nippon Aerosil Co., Ltd.

TABLE 17

| Dicyandiamide/curing agent | Composition (part by weight) | | | | | | |
|---|---|---|---|---|---|---|---|
| Dicyandiamide | 0.5 | 1 | 2 | 5 | 10 | 1 | 2 |
| 2-Phenylimidazole | 1 | 1 | 1 | 1 | 1 | — | — |
| 2,4-Diamino-6-{2'-methylimidazole-(1')}ethyl-2-triazine | — | — | — | — | — | 0.2 | 0.2 |
| Characteristics — Coating property | Satisfactory | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory | Satisfactory |
| Developability | Satisfactory | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory | Satisfactory |
| Resistance to plating reaction | Satisfactory | Satisfactory | Satisfactory | Satisfactory | Satisfactory | Satisfactory | Satisfactory |
| Resistance to dissolution by plating | Unsatisfactory | Unsatisfactory | Unsatisfactory | Unsatisfactory | Unsatisfactory | Unsatisfactory | Unsatisfactory |
| Heat resistance | — | — | — | — | — | — | — |
| Insulating property | — | — | — | — | — | — | — |

| Dicyandiamide/curing agent | Composition (part by weight) | | | | | |
|---|---|---|---|---|---|---|
| Dicyandiamide | 1 | 2 | 1 | 2 | 1 | 2 |
| 2-Phenylimidazole | — | — | — | — | — | — |
| 2,4-Diamino-6-{2'-methylimidazole-(1')}ethyl-2-triazine | 0.5 | 0.5 | 1 | 1 | 2 | 2 |
| Characteristics — Coating property | Satisfactory | Satisfactory | Satisfactory | Satisfactory | Satisfactory | Satisfactory |
| Close-contact exposability | Satisfactory | Satisfactory | Satisfactory | Satisfactory | Satisfactory | Satisfactory |
| Developability | Satisfactory | Satisfactory | Satisfactory | Satisfactory | Satisfactory | Satisfactory |
| Resistance to backside curing | Satisfactory | Satisfactory | Satisfactory | Satisfactory | Satisfactory | Satisfactory |
| Alkali resistance | Satisfactory | Satisfactory | Satisfactory | Satisfactory | Satisfactory | Satisfactory |
| Resistance to plating reaction | Satisfactory | Satisfactory | Satisfactory | Satisfactory | Satisfactory | Satisfactory |
| Resistance to dis- | Unsatis- | Unsatis- | Unsatis- | Unsatis- | Unsatis- | Unsatis- |

TABLE 17-continued

| | | | | | | |
|---|---|---|---|---|---|---|
| solution by plating | factory | factory | factory | factory | factory | factory |
| Heat resistance | — | — | — | — | — | — |
| Insulating property | — | — | — | — | — | — |

We claim:

1. A photo-setting resist composition which comprises:

(A) a polyfunctional unsaturated compound which is a diallylphthalate resin and which is solid at room temperature, (B) a polyfunctional unsaturated compound which has at least two ethylenic linkages in the molecule and which is liquid at room temperature, (C) a photopolymerization initiator, (D) an epoxy resin, and (E) a mixture of (a) at least one curing agent for the epoxy resin selected from the group consisting of
2-phenylimidazole,
2-methylimidazole,
2-ethylimidazole,
2-ethyl-4-methylimidazole,
1-(2-cyanoethyl)-2-phenylimidazole,
4,4'-diaminodiphenylmethane,
1-o-tolylbiguanide, and
2,4-diamino-6-{(2'-methylimidazole(1')}-ethyl-s-triazine, and (b) melamine or a derivative thereof selected from the group consisting of
2,4-diamino-6-methyl-s-triazine,
2,4-diamino-6-phenyl-s-triazine, and
2,4-diamino-6-hydroxy-s-triazine, the weight ratio of component (D) to component (A) being within the range of from 5:100 to 40:100, the weight ratio of the curing agent for the epoxy resin to component (A) being within the range of from 0.1:100 to 5:100, and the weight ratio of the melamine or derivative thereof to component (A) being within the range of from 1:100 to 20:100.

2. The photo-setting resist composition according to claim 1, wherein the component (A) is a prepolymer of diallyl phthalate and the component (B) is a polyfunctional acrylate or a polyfunctional methacrylate.

3. The photo-setting resist composition according to claim 2, wherein the prepolymer of diallyl phthalate has a molecular weight of from 3,000 to 30,000 and the polyfunctional acrylate or polyfunctional methacrylate contains at least 3 functional groups.

4. The photo-setting resist composition according to claim 1, wherein the melamine or the derivative thereof has a solubility in water of 1% or less by weight.

5. The photo-setting resist composition according to claim 1, wherein the amount blended of the component (B) ranges from 5 to 30 parts by weight, and the amount blended of the component (C) ranges from 2 to 12 parts by weight, per 100 parts by weight of the component (A).

6. The photo-setting resist composition according to claim 5, wherein the component (A) is a prepolymer of diallyl phthalate and the component (B) is a polyfunctional acrylate or a polyfunctional methacrylate.

7. The photo-setting resist composition according to claim 6, which further comprises 0.5 to 10 parts by weight of a defoaming agent, 50 to 100 parts by weight of a solvent and 0.2 to 10 parts by weight of pigment, per 100 parts by weight of the component (A).

8. The photo-setting resist composition according to claim 5, which further comprises 0.5 to 10 parts by weight of a defoaming agent, 50 to 100 parts by weight of a solvent and 0.2 to 10 parts by weight of a pigment, per 100 parts by weight of the component (A).

9. A photo-setting resist composition which is dicyandiamide-free and which comprises:

(A) a polyfunctional unsaturated compound which is a diallylphthalate resin and which is solid at room temperature, (B) a polyfunctional unsaturated compound which has at least two ethylenic linkages in the molecule and which is liquid at room temperature, (C) a photopolymerization initiator, (D) an epoxy resin, and (E) at least one member selected from the group consisting of:

(i) a mixture of (a) at least one curing agent for the epoxy resin selected from the group consisting of
2-phenylimidazole,
2-methylimidazole,
2-ethylimidazole,
2-ethyl-4-methylimidazole,
1-(2-cyanoethyl)-2-phenylimidazole,
4,4'-diaminodiphenylmethane,
1-o-tolylbiguanide, and
2,4-diamino-6-{(2'-methylimidazole(1')}-ethyl-s-triazine, and (b) melamine or a derivative thereof selected from the group consisting of
2,4-diamino-6-methyl-s-triazine,
2,4-diamino-6-phenyl-s-triazine, and
2,4-diamino-6-hydroxy-s-triazine, and (ii) at least one compound having a 2,4-diamino-s-triazine ring and an imidazole ring in the molecule selected from the group consisting of
2,4-diamino-6-{2'-methylimidazole-(1)}-ethyl-s-triazine,
2,4-diamino-6-{2'-ethyl-4'-methylimidazole'(1')}-ethyl-s-triazine,
2,4-diamino-6-{2'-undecylimidazole-(1')}-ethyl-s-triazine,
2,4-diamino-6-{2'-phenylimidazole-(1')}-ethyl-s-triazine,
2,4-diamino-6-{2'-methylimidazole-(1')}-ethyl-s-triazine/isocyanuric acid adduct, the weight ratio of component (D) to component (A) being within the range of from 5:100 to 40:100, the weight ratio of the curing agent for the epoxy resin to component (A) being within the range of from 0.1:100 to 5:100, the weight ratio of the melamine or derivative thereof to component (A) being within the range of from 1:100 to 20:100, and the weight ratio of the compound having a 2,4-diamino-s-triazine ring and an imidazole ring in the molecule to component (A) being within the range of from 1:100 to 20:100.

10. The photo-setting resin composition according to claim 9, wherein the amount of component (B) ranges from 5 to 30 parts by weight and the amount of (C) ranges from 2 to 12 parts by weight per 100 parts by weight of the component (A).

11. The photo-setting resist composition according to claim 9, wherein the member (ii) is selected as the component (E).

12. The photo-setting resist composition according to claim 11, wherein the component (A) is a prepolymer of diallyl phthalate and the component (B) is a polyfunctional acrylate or a polyfunctional methacrylate.

* * * * *